United States Patent [19]

Nishiura et al.

[11] Patent Number: 5,705,835
[45] Date of Patent: Jan. 6, 1998

[54] SEMICONDUCTOR DEVICE AND METHOD OF MANUFACTURING THE SAME

[75] Inventors: Akira Nishiura; Masahito Otsuki, both of Kawasaki, Japan

[73] Assignee: Fuji Electric Co., Ltd., Kanagawa, Japan

[21] Appl. No.: 562,566

[22] Filed: Nov. 24, 1995

[30] Foreign Application Priority Data

Nov. 25, 1994 [JP] Japan .................. 6-291859

[51] Int. Cl.$^6$ ............ H01L 27/74; H01L 29/76; H01L 29/94
[52] U.S. Cl. ............ 257/147; 257/107; 257/110; 257/120; 257/138; 257/329; 257/330
[58] Field of Search ............ 257/120, 132, 257/133, 140, 141, 142, 143, 144, 146, 147, 107, 263, 329, 330–332, 110

[56] References Cited

U.S. PATENT DOCUMENTS

| 4,777,517 | 10/1988 | Onodera et al. | 257/274 |
|---|---|---|---|
| 5,194,394 | 3/1993 | Terashima | 257/133 |
| 5,410,170 | 4/1995 | Bulucea et al. | 257/330 |
| 5,506,421 | 4/1996 | Palmour | 257/330 |

FOREIGN PATENT DOCUMENTS

| 1003078 | 3/1991 | Germany | 257/147 |
|---|---|---|---|
| 4-268766 | 9/1992 | Japan . | |
| 5-190836 | 7/1993 | Japan . | |
| 5-28395 | 8/1993 | Japan . | |
| 6-125078 | 5/1994 | Japan . | |
| 6-232387 | 8/1994 | Japan . | |

Primary Examiner—Tom Thomas
Assistant Examiner—Fetsum Abraham
Attorney, Agent, or Firm—Finnegan, Henderson, Farabow, Garrett & Dunner, L.L.P.

[57] ABSTRACT

A second region 3 is formed via a buffer layer 3a on a first region 2 formed with an anode electrode 1 on the rear and a third region 4 like a well is formed on the surface of the second region 3. A fourth region 15 like a well is formed at the center on the surface of the third region 4 and a fifth region 16 is formed along the well end. A sixth region 17 like a well is formed on the surface of the fourth region 15. Cathode electrodes 18 as metal electrodes of the first layer come in conductive contact with the fifth region 16 and the sixth region 17. A MOSFET 12 of n channel type for injecting majority carriers (electrons) is disposed from the first region 16 to the surfaces of the third region 4 and the second region 3, and a MOSFET 23 of p channel type is disposed from the sixth region 17 to the surfaces of the fourth region 16 and the third region 4. The second MOSFET 23 has a double diffusion type structure.

29 Claims, 26 Drawing Sheets

THYRISTOR STATE

TRANSISTOR STATE

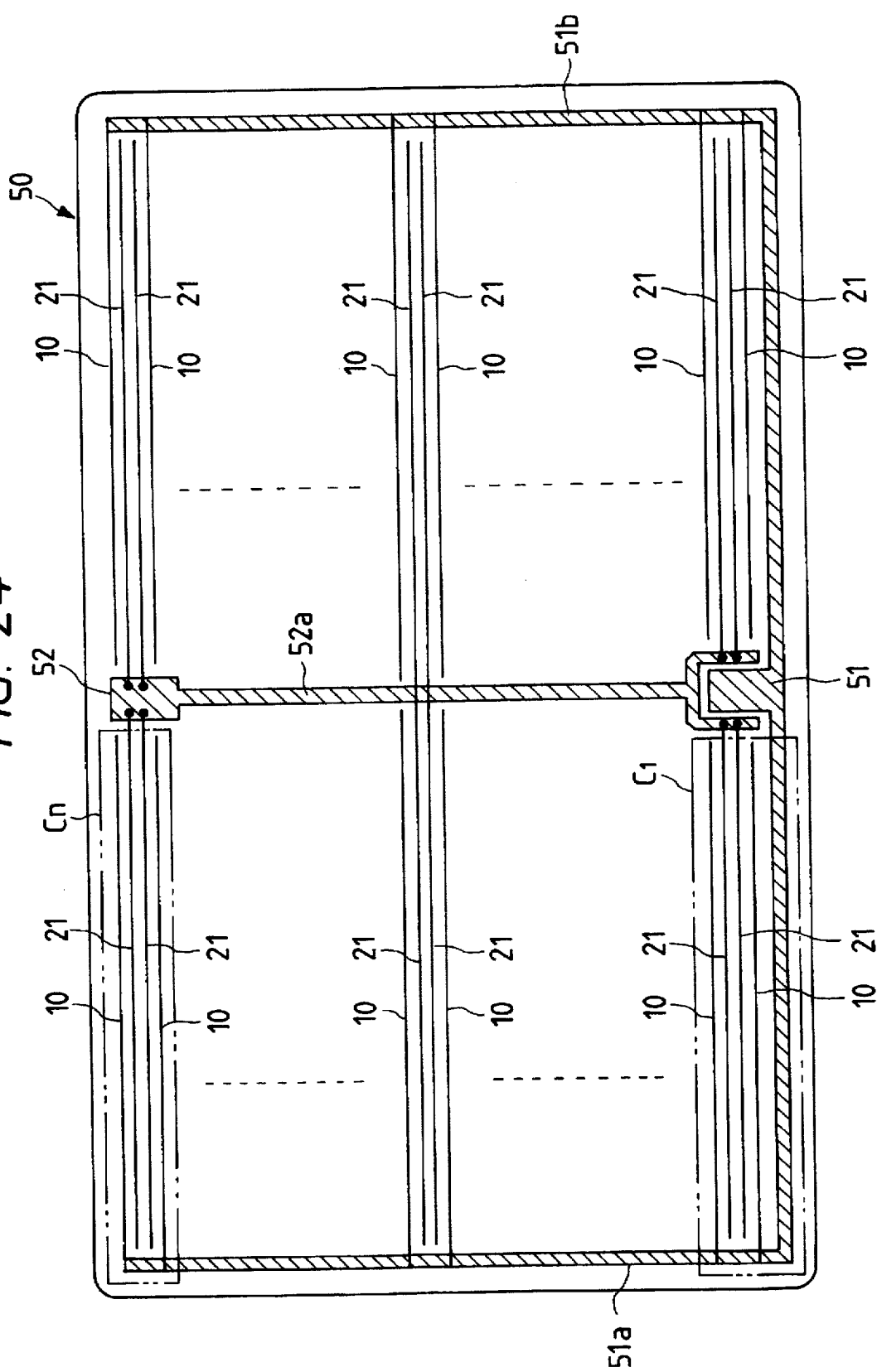

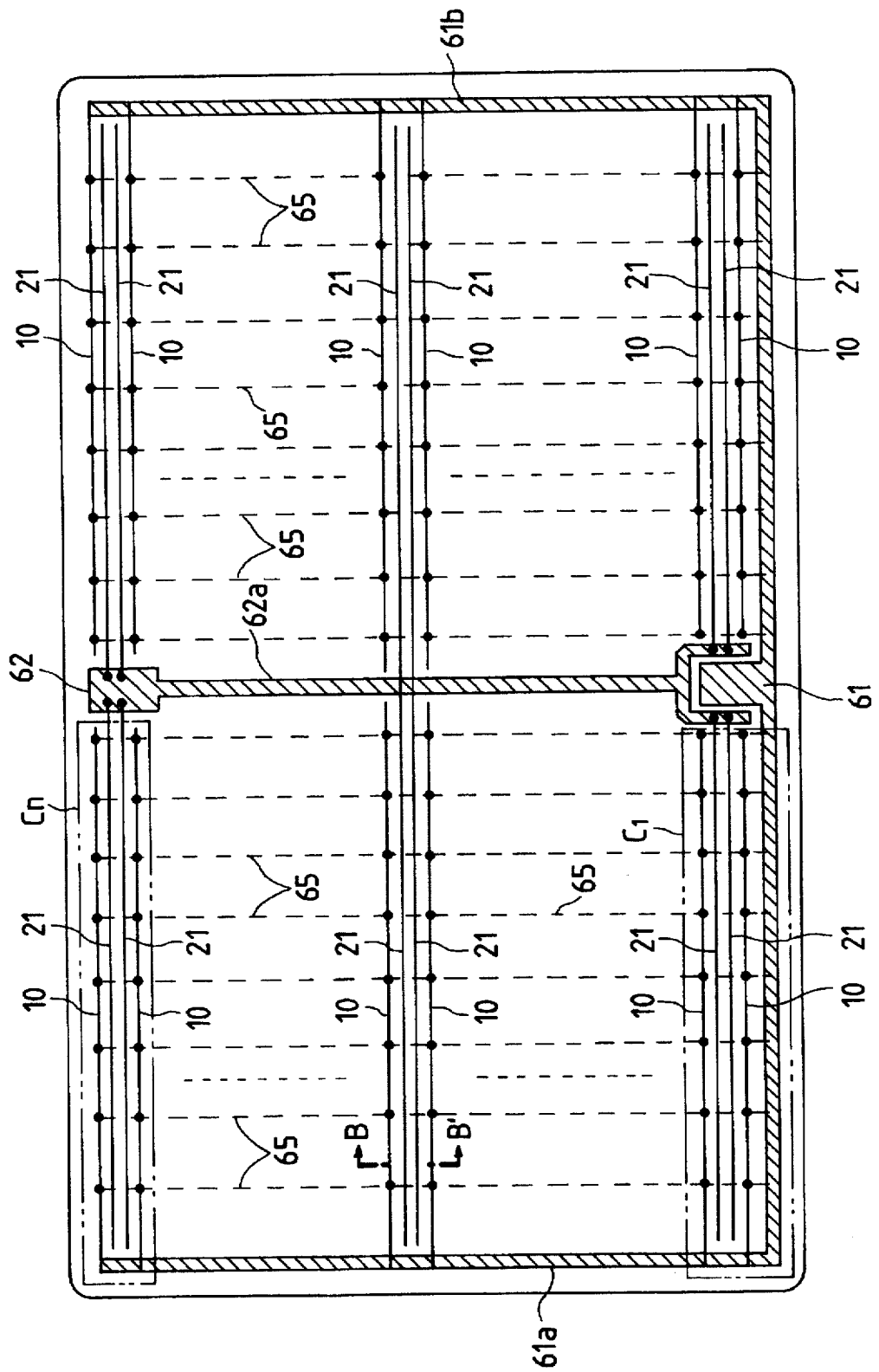

(THYRISTOR STATE)

(BIPOLAR TRANSISTOR STATE)

SEMICONDUCTOR DEVICE AND METHOD OF MANUFACTURING THE SAME

BACKGROUND OF THE INVENTION

1. Field of the Invention

This invention relates to a thyristor of a pnpn structure used for switching power devices, etc., and in particular to a semiconductor device of a double MIS gate type thyristor having two gate electrodes, and a method of manufacturing such a semiconductor device.

2. Description of the Related Art

In recent years, an MCT (MOS controlled thyristor) has been developed for decreasing on voltage by a thyristor structure and for high-speed operation and low drive power by an MIS gate device. The MCT is fast in turn on and excellent in on-stage voltage drop of about 1 V, but has extremely long turn off time of 2–3 μsec and is difficult to use at high frequency applications. The present applicant disclosed a semiconductor device including a gate-drive thyristor and a bipolar transistor in combination in Japanese Patent Application No. Hei 5-32884 (Japanese Patent Laid-Open No. Hei 6-125078).

The semiconductor device has a semiconductor substrate of $p^+$ type (first conductivity type) formed with a collector electrode (anode electrode) 1 on the backside as a collector layer 2 on which a base layer 3 of $n^-$ type (second conductive type) is formed by epitaxial growth, as shown in FIG. 35. A buffer layer of $n^+$ type may be provided between the collector layer 2 and the base layer 3. A p-type well-like base layer 4 is diffused on the surface of the $n^-$-type base layer 3. Further, three independent $n^+$-type well-like layers, a first emitter layer 5a on the outer peripheral surface, a second emitter layer 5b at the center, and a drain layer 6 on the inner peripheral surface are formed on the inner surface of the p-type base layer 4. A short-circuit electrode (metal electrode) 8 is connected to the tops of the p-type base layer 4 and the $n^+$-type drain layer 6; it extends over and comes in conductive contact with the layers 4 and 6. The $n^+$-type emitter layers 5a and 5b are interconnected via an emitter electrode 7 of the second layer formed on an interlayer insulating film 14. A first gate electrode 10 of polycrystalline silicon forming a first MOSFET 12 via a gate oxide film 9 is formed from the $n^+$-type emitter layer (first emitter layer) 5a to the surfaces of the p-type base layer 4 and the $n^-$-type base layer 3. On the other hand, a second gate electrode 11 of polycrystalline silicon forming a second MOSFET 13 via a gate oxide film 9 is formed from the $n^+$-type drain layer 6 to the surfaces of the p-type base layer 4 and the $n^+$-type emitter layer (second emitter layer) 5b. The first and second gate electrodes 10 and 11 can be controlled independently. The first MOSFET 12 formed by the first gate electrode 10 and the second MOSFET 13 formed by the second gate electrode 11 are both n-channel-type MOSFETs (metal oxide semiconductor field effect transistors).

FIG. 36 shows an equivalent circuit of the semiconductor device in FIG. 35. In the semiconductor structure, the first $n^+$-type emitter layer 5a, the p-type base layer 4, and the $n^-$-type base layer 3 make up an npn-type bipolar transistor Qnpn1 and the second $n^+$-type emitter layer 5b, the p-type base layer 4, and the $n^-$-type base layer 3 make up an npn-type bipolar transistor Qnpn2. Further, the p-type base layer 4, the $n^-$-type base layer 3, and the $p^+$-type collector layer 2 make up a pnp-type bipolar transistor Qpnp. Therefore, the parallel-connected transistors Qnpn1 and Qnpn2 having different emitter layers 5a and 5b and the transistor Qpnp form a thyristor structure (npnp structure).

For the transistors Qnpn1, Qnpn2, and Qpnp, the first MOSFET 12 connects the n-type base layer 3 of the collector of the transistor Qnpn1 and the first emitter layer 5a via the p-type base layer 4 for injecting electrons into the n-type base layer 3. The short-circuit electrode 8 and the second MOSFET 13 connect the drain layer 6 and the second emitter layer 5b for drawing out holes from the base layer 4.

In the configuration, when no potential is applied or negative potential is applied to the second gate electrode 11, if the first gate electrode 10 is placed at high potential, the surface of the p-type base layer 4 of a back gate just below the first gate electrode 10 becomes an n-type inversion layer, and the n-type emitter layer 5a as a source layer, the n-type inversion layer just below the first gate electrode 10, and the $n^-$-type base layer 3 as a drain layer are connected from the emitter electrode 7. Therefore, electrons (majority carriers) are injected into the $n^-$-type base layer 3 of a drift region from the emitter electrode 7 and responding it, holes (majority carriers) are injected into the $n^-$-type base layer 3 from the $p^+$-type collector layer 2. This means that the pnp-type transistor Qpnp is turned on. Further, the hole current of the transistor Qpnp becomes base current of the transistors Qnpn1 and Qnpn2, turning on the transistors Qnpn1 and Qnpn2. That is, the thyristor (npnp structure) made up of the $p^+$-type collector layer 2, the $n^-$-type base layer 3, the p-type base layer 4, and the $n^+$-type emitter layers 5a and 5b is turned on; carriers at high density exists in the device and the semiconductor device becomes low resistance. Thus, the first gate electrode 10 is placed at high potential in a state in which the second gate electrode 11 is placed at zero potential, whereby the device enters a thyristor state like the MCT, so that it becomes a power device fast in turn on and having low on-state voltage drop.

When the second gate electrode 11 is placed at high potential with the first gate electrode 10 remaining at high potential from the on state, the second MOSFET 13 is also turned on and the surface of the p-type base layer 4 just below the second gate electrode 11 is inverted to the n type. Since holes on the p-type base layer 4 are converted into electrons at the short-circuit electrode 8, the p-type base layer 4, the short-circuit electrode 8, the $n^+$-type drain layer 6, the n-type inversion layer just below the second gate electrode 11, and the $n^+$-type emitter layer 5b are rendered conductive. Thus, hole current injected from the $p^+$-type collector layer 2 is converted into electron current at the short-circuit electrode 8 from the p-type base layer 4 and the electron current flows out into the emitter electrode 7b. Therefore, the bipolar transistors Qnpn1 and Qnpn2 are turned off. This results in a transistor state in which the thyristor operation is lost and only the bipolar transistor Qpnp operates. This state is like the operation state of the IGBT (insulated gate bipolar transistor) (electrons are injected at the first MOSFET and the conductivity of the base layer 3 is modulated), and the carrier density existing in the device decreases as compared with the thyristor state. Thus, when the first gate electrode 10 is later placed at negative potential for turning off the device, the time required for sweeping out the carriers can be shortened, shortening the turn off time.

FIGS. 37A and 37B show current flows in a thyristor state and a transistor state (IGBT state). In the thyristor state shown in FIG. 37A, hole current and electron current flow as a unit from the emitter electrode 7 to the p-type base layer 4 to the $n^-$-type base layer 3, carrying out the thyristor operation.

Particularly, the main current flows linearly just below the $n^+$-type emitter layer 5b at the center and the $n^+$-type emitter layer 5b serves substantially as a cathode of the thyristor.

In contrast, in the bipolar transistor state shown in FIG. 37B, the main electron current of the device flows from the n⁻-type base layer 3 through the channel of the first MOSFET 12 to the emitter layer 5a as in the IGBT, and hole current enters the p-type base layer 4 from the side of the first MOSFET 12 and flows through the second MOSFET 13 via the n⁺-type drain layer 6 into the emitter electrode 7b. Thus, the main current in the transistor state does not flow through the downward region of the n⁺-type emitter layer 5b at the center, the main current path in the thyristor state; the main current in the thyristor state and that in the transistor state are made to flow in separate paths. That is, the first emitter layer 5a, a source at the first MOSFET 12 for injecting electrons, majority carriers to turn on the thyristor, and the second emitter layer 5b, a substantial cathode through which the main current at the thyristor operation time flows are separated from each other. Since the impurity density in the downward region of the first emitter layer 5a and that in the downward region of the second emitter layer 5b can be controlled independently of each other, the thyristor operation mode can be entered at low on-state voltage drop, thereby not only shortening the turn off time, but also increasing the latch-up immunity amount (maximum controllable current).

However, the semiconductor structure involves the following problems:

(1) When the transition is made from the thyristor state to a bipolar transistor state (IGBT state), holes are drawn out from the p-type base layer 4, thus it is necessary to dispose the second MOSFET 13 of the n channel type on the surface of the p-type base layer 4. To convert the drawn out holes into electrons, monopole of the second MOSFET, the short-circuit electrode (metal electrode) 8 is formed isolatedly and finely extending over the p-type base layer 4 and the n⁺-type drain layer 6. However, generally it is difficult to form the metal electrode 8 finely. Also, the first and second emitter layers 5a and 5b with the metal electrode 8 of the first layer between need to be interconnected via the emitter electrode 7 of the second layer formed on the interlayer insulating film 14; the vertical 2-layer electrode wiring structure of the power device is not practical on the process or insulation.

(2) If the on-state resistance of the second MOSFET 13 is decreased, drawing out holes from the p-type base layer 4 can be hastened at the bipolar transistor operation time, speeding up the turn off operation. However, like the first MOSFET 12, the second MOSFET 13 is formed using the gate electrode 11 of polycrystalline silicon as a mask and has source drain self-aligned on both sides of the gate. The channel length is determined by the gate length of the gate electrode 11 of polycrystalline silicone as the mask; the practical length of the gate electrode 11 is about 1 μm even in the fine pattern process. Shortening the channel has a limit and the on resistance is hard to decrease. MOS transistor characteristics are prone to vary.

SUMMARY OF THE INVENTION

The present invention has been made in view of the above, and therefore an object of the invention is to provide a semiconductor device which has a second MOSFET of inverse conductivity type to a first MOSFET for eliminating the need for forming a short-circuit electrode for carrier conversion and avoiding difficulty in fine electrode formation and a 2-layer structure of electrode wiring and puts the second MOSFET itself into low on resistance.

To the end, in the invention, to make MISFET for injecting majority carriers and MISFET for drawing out majority carriers inverse conductivity type to each other, the MISFET for drawing out majority carriers adopts a double diffusion type structure. That is, according to one aspect of the invention, there is provided a semiconductor device including a first semiconductor region of first conductivity type, a second semiconductor region of second conductivity type, a third semiconductor region of first conductivity type formed like a well in the second semiconductor region, a fourth semiconductor region of second conductivity type formed like a well on a surface in the third semiconductor region, a fifth semiconductor region of second conductivity type formed like a well on a well end on the surface in the third semiconductor region, a sixth semiconductor region of first conductivity type formed like a well on a surface in the fourth semiconductor region, a MISFET of second conductivity type which enables majority carriers thereof to be injected into the second semiconductor region from the fifth semiconductor region, and a MISFET of first conductivity type having a double diffusion type structure which can be enabled and disabled independently of the first MISFET and enables majority carriers thereof to be drawn out into the sixth semiconductor region from the third semiconductor region.

Preferably, the third semiconductor region just below the fifth semiconductor region is formed with a seventh semiconductor region of first conductivity type having an impurity density higher than the third semiconductor region. The seventh semiconductor region may be a shallow well region to such a degree that a part of the third semiconductor region is left just below the fifth semiconductor region, or may be a deep well region to such a degree that it pierces the third semiconductor region left just below the fifth semiconductor region and abuts on the second semiconductor region.

The MISFET of first conductivity type and the MISFET of second conductivity type may be of enhancement type or depletion type; preferably, one is of enhancement type and the other is of depletion type. For example, if the channel region is formed as an inversion layer of first conductivity type, the MISFET of first conductivity type can be made the enhancement type and the MISFET of second conductivity type can be made the depletion type.

To draw out majority carriers, the invention can adopt a structure wherein a short-circuit electrode conducting with an electrode coming in conductive contact with the fifth and sixth semiconductor regions is brought into conductive contact with the third semiconductor region. Particularly, preferably the third semiconductor region is a stripe-like well and the short-circuit electrode is formed on an end surface in the length of the well.

The sixth semiconductor region can have a large number of protrusions like comb teeth piercing the fourth semiconductor region in a lateral direction and abutting on the third semiconductor region.

The invention can adopt a structure wherein a plurality of double diffusion type structures of the fourth and sixth semiconductor regions are formed repeatedly in a region sandwiched planarly between a pair of the isolated fifth semiconductor regions formed on an well end of the third semiconductor region. Further, the invention can adopt a structure wherein a double diffusion type structure of the fourth and sixth semiconductor regions and an eighth semiconductor region of first conductivity type are formed alternately and repeatedly in a region sandwiched planarly between a pair of the isolated fifth semiconductor regions formed on an well end of the third semiconductor region.

According to another aspect of the invention, there is provided a method of manufacturing the semiconductor device including a first ion implantation step of preparing a substrate having a second semiconductor conductive layer formed on a semiconductor substrate of first conductivity type and forming gate electrodes of MISFETs of first and second conductivity types, then ion-implanting impurities of first conductivity type with the gate electrodes of MISFETs of first and second conductivity types as a mask, a second ion implantation step of ion-implanting impurities of second conductivity type with the gate electrodes of MISFETs of first and second conductivity types as a mask, a first thermal diffusion step of diffusing and forming the third semiconductor region like a well by linking contiguous diffusion regions of the impurities of first conductivity type below the gate electrode of the MISFET of first conductivity type by drive-in and diffusing and forming the fourth semiconductor region, a third ion implantation step of ion-implanting impurities of second conductivity type with the gate electrodes of MISFETs of first and second conductivity types as a mask, a fourth ion implantation step of ion-implanting impurities of first conductivity type with the gate electrodes of MISFETs of first and second conductivity types as a mask, and a second thermal diffusion step of diffusing and forming the fifth and sixth semiconductor regions by drive in. Preferably, the diffusion coefficient of the impurities of first conductivity type used in the first ion implantation step is larger than that of the impurities of second conductivity type used in the second ion implantation step. Here, it should be noted that the drive-in process is defined as follows: That is, a diffused layer is formed through two processes. In a first process, impurities are introduced to a depth of several tenth of 1 μm within the interior of a semiconductor. This step is called a "a pre-deposition process". Once the impurities has been introduced into the interior of the semiconductor, they are diffused more deeply so as to provide an appropriate concentration distribution. In this situation, no any other impurities are added to the semiconductor. This second step is called "a drive-in process".

In the semiconductor device of the invention, when anode potential is applied to the first semiconductor region of first conductivity type and cathode potential is applied to the fifth semiconductor region of second conductivity type and the sixth semiconductor region of first conductivity type, if the MISFET of second conductivity type is turned on with the MISFET of first conductivity type remaining off, its majority carriers are injected into the second semiconductor region of second conductivity type from the fifth semiconductor region as a source region of the second MISFET, responding to which its minority carriers are injected into the second semiconductor region of second conductivity type from the first semiconductor region of first conductivity type, thus turning on the transistor consisting of the first semiconductor region of first conductivity type, the second semiconductor region of second conductivity type, and the third semiconductor region of first conductivity type, thereby its majority carriers are injected into the third semiconductor region of first conductivity type and at the same time, the transistor consisting of the second semiconductor region of second conductivity type, the third semiconductor region of second conductivity type, the third semiconductor region of first conductivity type, and the fifth semiconductor region of second conductivity type is turned on. Therefore, the thyristor of pnpn structure consisting of the first semiconductor region of first conductivity type, the second semiconductor region of second conductivity type, the third semiconductor region of first conductivity type, and the fifth semiconductor region of second conductivity type is turned on. Thus, the on voltage can be lowered by the thyristor operation.

On the other hand, if the MISFET of first conductivity type is turned on with the MISFET of second conductivity type remaining on, its majority carriers in the third semiconductor region of first conductivity type flow out into the sixth semiconductor region of first conductivity type via the MISFET of first conductivity type, thus turning off the transistor made up of the second semiconductor region of second conductivity type, the third semiconductor region of first conductivity type, and the fifth semiconductor region of second conductivity type. Thus, the transition is made from the thyristor state to the transistor state like IGBT and the carrier density in the device decreases. After this, if the MISFET of second conductivity type is turned off, the transistor state instantaneously is turned off, shortening the turn off time of the thyristor structure.

Since the MISFET for drawing out majority carriers in the third semiconductor region is of first conductivity type inverse to the conductivity type of the MISFET for injecting majority carriers in the second semiconductor region, the majority carriers in the third semiconductor region can be directly drawn out via the MISFET of first conductivity type, eliminating the need for forming the short-circuit electrode (metal electrode) for converting carriers as electrode wiring on the first layer as in the conventional structure. Thus, difficulty in forming fine electrodes and the 2-layer structure of electrode wiring can be avoided.

Since the MISFET of first conductivity type is a double diffusion type structure MISFET, the channel can be shortened by self-alignment and the MISFET itself can be put into low on-state resistance, thus hastening the majority carrier drawing out speed and increasing the turn off speed. Further, characteristic variations of the MISFET can also be suppressed.

In the structure wherein the third semiconductor region just below the fifth semiconductor region is formed with the seventh semiconductor region of first conductivity type having an impurity density higher than the third semiconductor region, the parasitic resistance value below the fifth semiconductor region can be reduced, thus the latch-up in the transistor state can be suppressed and the controllable current value can be increased.

If one of the MISFET of first conductivity type and the MISFET of second conductivity type is of enhancement type and other is of depletion type, on/off control of the MISFETs can also be performed with either positive or negative power supply of gate voltage, so that the gate drive circuit can be simplified.

In the structure wherein the short-circuit electrode conducting with the electrode coming in conductive contact with the fifth and sixth semiconductor regions is brought into conductive contact with the third semiconductor region, in the transistor state the majority carriers in the third semiconductor region can be directly drawn out not via the MISFET of first conductivity type and the controllable current value can be increased. Particularly, current concentration occurs in the corners (ends of the cell) and latch-up is prone to occur, but in the structure wherein the third semiconductor region is a stripe-like well and the short-circuit electrode is formed on the end surface in the length of the well, the latch-up in the corners can be suppressed and in the thyristor operation mode, the majority carrier density in the third region can also be enriched. If anode-cathode voltage is applied with the MISFETs of first and second conductivity types remaining off, current leaks into the cathode via the short-circuit electrode, preventing latch-up to occur when power is turned on.

If the sixth semiconductor region has a large number of protrusions like comb teeth (for example, 100 protrusions in the region of 2 mm length in a cycle of 20 μm) piercing the fourth semiconductor region in a lateral direction and abutting on the third semiconductor region to elongate a peripheral length, the majority carriers in the third semiconductor region can be directly drawn out, suppressing latch-up at the transistor operation time.

In the structure wherein a plurality of double diffusion structures of the fourth and sixth semiconductor regions are formed repeatedly in the region sandwiched planarly between a pair of the isolated fifth semiconductor regions formed on the well end of the third semiconductor region as a cell pattern of the invention, a large number of distributed MOSFETs of first conductivity type are formed in parallel at the center for distributively drawing out the majority carriers. Thus, latch-up in the transistor state is efficiently prevented, thereby increasing controllable current.

In the structure wherein a double diffusion structure of the fourth and sixth semiconductor region and the eight semiconductor region of first conductivity type are formed alternately and repeatedly in the region sandwiched planarly between a pair of the isolated fifth semiconductor regions formed on the well end of the third semiconductor region as another cell pattern of the invention, the majority carriers are drawn out by a large number of MOSFETs of fifth conductivity type and directly drawn out by the eighth semiconductor region of first conductivity type, so that the carrier drawing out force can be enhanced.

The manufacturing method of the invention links contiguous diffusion regions of impurities of first conductivity type just below the gate electrode of MISFET of first conductivity type by drive in in the first thermal diffusion step. Thus, all conductive regions can be formed by self-alignment with the gate electrodes of MISFETs of first and second conductivity types as a mask, reducing the number of steps and enhancing semiconductor region formation accuracy.

When the diffusion coefficient of the impurities of first conductivity type used in the first ion implantation step is larger than that of the impurities of second conductivity type used in the second ion implantation step, diffusion of the impurities of second conductivity type can be delayed for linking diffusion regions of impurities of first conductivity type to form a well.

The above and other objects and features of the present invention will be more apparent from the following description taken in conjunction with the accompanying drawings.

BRIEF DESCRIPTION OF THE DRAWINGS

In the accompanying drawings:

FIG. 24 is a plan view showing a chip layout of the thyristor semiconductor device with a double gate in the first embodiment of the invention;

FIG. 25 is a plan view showing a chip layout of a thyristor semiconductor device with a double gate according to a twentieth embodiment of the invention;

DETAILED DESCRIPTION OF THE PREFERRED EMBODIMENTS

Now, a description will be given of preferred embodiments of the invention with reference to the accompanying drawings.

Figure 1:
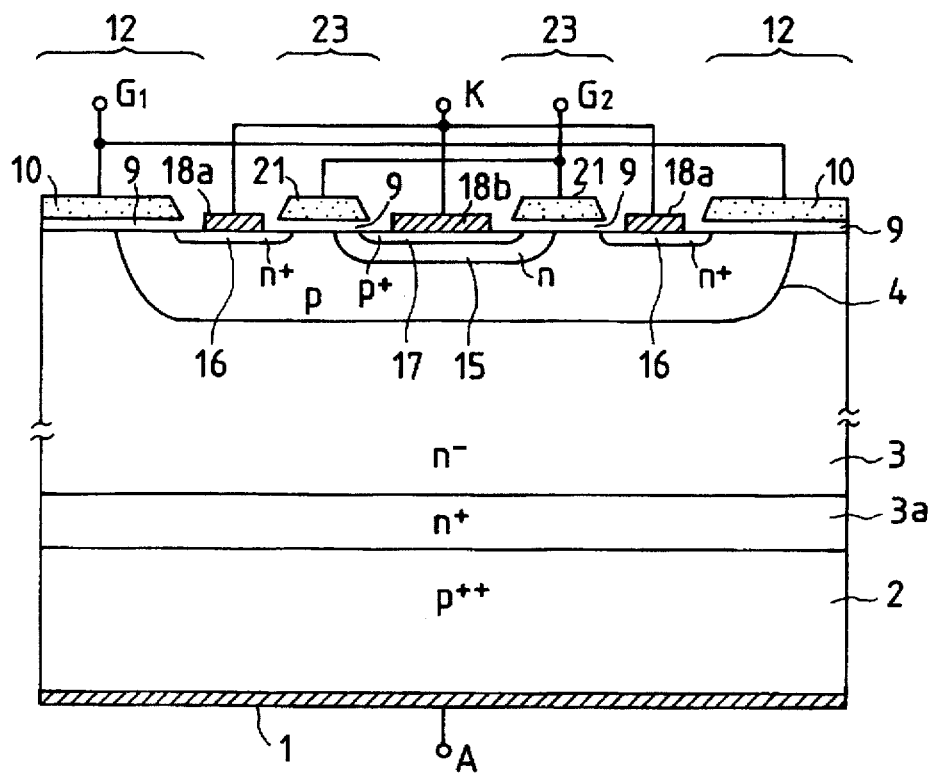
FIG. 1 is a sectional view showing the structure of a semiconductor device with a double gate according to a first embodiment of the invention.

Embodiment 1:

FIG. 1 shows the structure of a semiconductor device including a double gate according to a first embodiment of the invention. The semiconductor device of the embodiment has a semiconductor substrate of $p^{++}$ type (first conductivity type) formed with an anode electrode 1 on the rear as a first region (anode region) 2 on which a second region $n^-$ type base layer 3 of $n^-$ type (second conductive type) is formed by epitaxial growth via an $n^+$-type buffer layer 3a. A third region (p type base layer) 4 of p type like a well is formed on the surface of the second region 3 of $n^-$ type. Further, a fourth region (channel diffusion layer) 15 of n type like a well is formed at the center on the surface of the third region 4 of p type and a fifth region (cathode region) 16 of $n^+$ type like a ring is formed along the well end of the third region 4 and separated from the fourth region 15. A sixth region 17 of p type like a sell is formed on the surface of the fourth region 15 at the center. A first cathode electrode 18a and a second cathode electrode 18b as metal electrodes of the first layer come in conductive contact with the fifth region 16 of n type and the sixth region 17 of p type.

A first gate electrode 10 of polycrystalline silicon forming a first MOSFET (VDMOS structure) 12 of n channel type via a gate oxide film (gate insulating film) 9 is disposed from the fifth region 16 of $n^+$ type to the surfaces of the third region 4 of p type and the second region 3 of $n^-$ type. On the other hand, a second gate electrode 21 of polycrystalline silicon forming a part of a second MOSFET (DMOS structure) 23 of p channel type via a gate oxide film 9 is disposed from the sixth region 17 of $p^+$ type to the surfaces of the fourth region 15 of n type, the fifth region 16 of $n^+$ type and the third region 4 of p type. The second MOSFET 23, which is a double diffusion type MOSFET, is provided by forming the fourth region 15 of n type on the surface of the third region 4 of p type well as a channel diffusion layer with the gate electrode 21 as a mask, then diffusing the sixth region 17 of $p^+$ type as a source layer on the surface of the fourth region 15 with the gate electrode 21 as a mask. The first MOSFET 12 for injecting electrons is of n channel type DMOS, while the second MOSFET 23 for drawing out holes is of p channel type DMOS and double diffusion type. Therefore, the channel of the second MOSFET 23 is a portion sandwiched between the third and sixth regions 4 and 17; it is shortened since the length of the channel is determined according to a difference in the lateral length of the diffusion. The first and second gate electrodes 10 and 21 can be controlled independently of each other.

Figure 2:
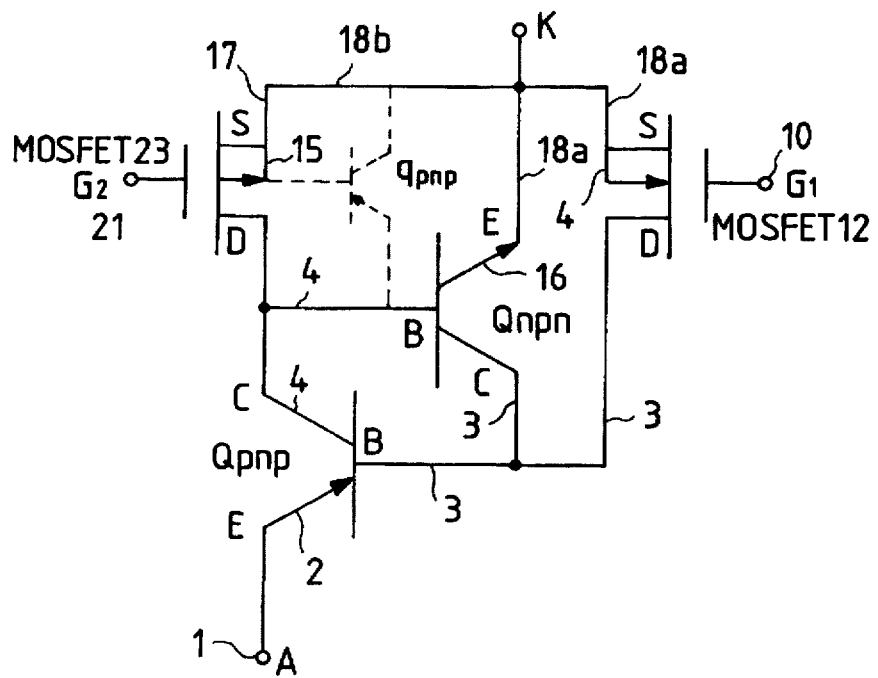
FIG. 2 is a circuit diagram showing an equivalent circuit of the semiconductor device shown in FIG. 1.

FIG. 2 shows an equivalent circuit of the semiconductor device. In the semiconductor device, the fifth region 16 of $n^+$ type, the third region 4 of p type, and the second region 3 of $n^-$ type make up an npn-type bipolar transistor Qnpn and the third region 4 of p type, the second region 3 of $n^-$ type, and the first region 2 of $p^{++}$ type make up a pnp-type bipolar transistor Qpnp. Therefore, the bipolar transistors Qnpn and Qpnp form a thyristor structure (pnpn structure). The third region 4 of p type, the fourth region 15 of n type, and the sixth region 17 of p type form a pnp-type parasitic transistor $q_{pnp}$ as shown by a broken line, but the third region 4 is short-circuited via the fifth region 16 to the cathode electrode 18a, suppressing the transistor function. The first MOSFET 12 injects its majority carriers (electrons) from the fifth region 16 via the third region 4 to the second region base layer 3, a base layer of the transistor Qpnp. The second MOSFET 23 draws out its majority carriers (holes) in the third region 4 via the fourth region 15 into the sixth region 17.

Figure 3A:
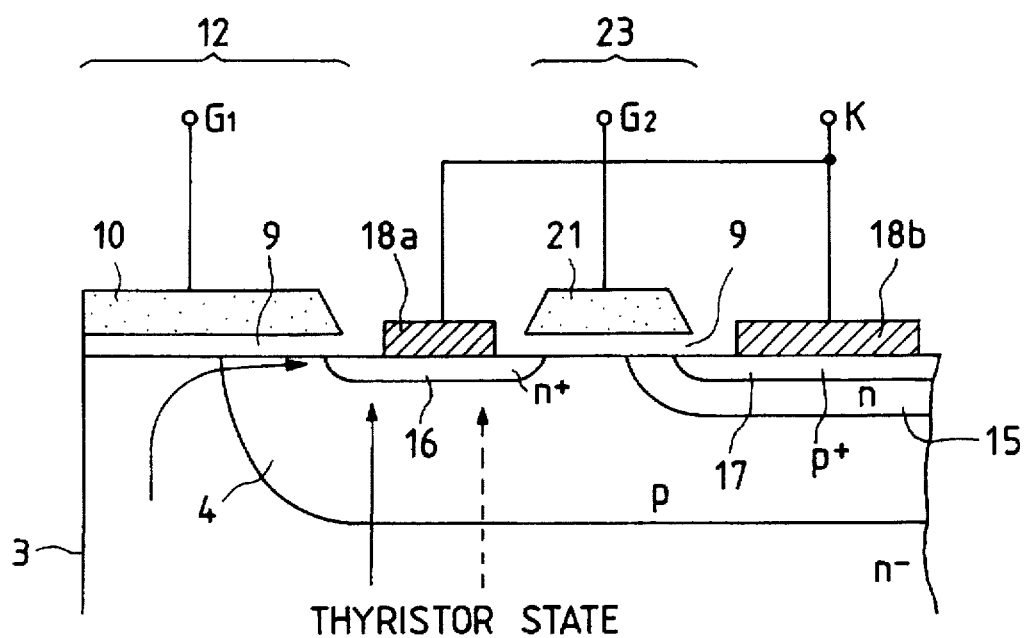
FIG. 3A is a sectional view showing flows of electron current and hole current in a thyristor state of the semiconductor device shown in FIG. 1.

In the semiconductor device of the configuration, when high potential is applied to the second gate electrode 21, if the first gate electrode 10 is placed at high potential, the well end surface of the p-type base layer 4 of a back gate just below the first gate electrode 10 becomes an n-type inversion layer, and the fifth region 16 of n type as source, the n-type inversion layer just below the first gate electrode 10, and the n⁻-type base layer 3 as a drain are connected from the cathode electrode 18a. Therefore, electrons as majority carriers are injected into the n⁻-type base layer 3 of a drain drift region from the cathode electrode 18a and responding it, holes are injected from the first region 2 of p⁺ type, whereby conductivity is modulated and the pnp-type transistor Qpnp is turned on (placed in IGBT state). Further, the hole current of the transistor Qpnp becomes base current of the transistor Qnpn, turning on the transistor Qnpn. That is, the thyristor (pnpn structure) made up of the first region 2 of p⁺ type, the second region 3 of n⁻ type, the third region 4 of p type, and the fifth region 16 of n⁺ type is turned on; carriers at high density exist in the device and the semiconductor device becomes low on-state voltage drop (about 1.2–1.3 V). Thus, in the semiconductor device, the first gate electrode 10 is placed at high potential in a state in which the second gate electrode 21 is placed at high potential, whereby the device enters a thyristor state like the MCT, so that it becomes a power device having low on-state voltage drop. As shown in FIG. 3A, in the thyristor state (thyristor mode), electron current (solid line) for injecting electrons flows into the fifth region 16 from the second region 3 via the channel of the first MOSFET 12, which is just under the gate electrode 10, on the well end of the third region 4 and the main current of the thyristor (the electron current indicated by the solid line and hole current indicated by a broken line) flows into the region just below the fifth region 16. The third region 4 of p type, the fourth region 15 of n type, and the sixth region 17 of p type form the pnp-type parasitic transistor $q_{pnp}$ as shown by the broken line in FIG. 2, but the third region 4 is pn-connected via the fifth region 16 to the cathode electrode 18a, suppressing the transistor function. The effect of drawing out some holes is produced from the third region 4 of p type, but carriers in the third region 4 are very ample in the thyristor operation; no problem arises.

Figure 3B:
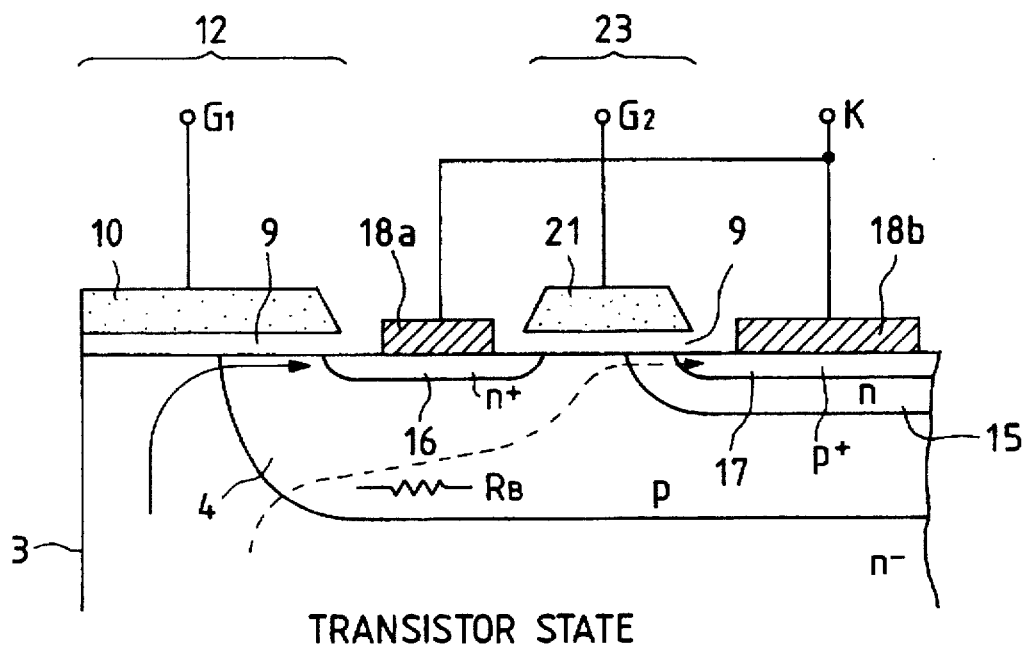
FIG. 3B is a sectional view showing flows of electron current and hole current in a transistor state (IGBT state) of the semiconductor device.

When the second gate electrode 21 is placed at zero or low potential with the first gate electrode 10 remaining at high potential from the thyristor state, the second MOSFET 23 is also turned on and the surface of the fourth region 15 of n type just below the second gate electrode 21 is inverted to the p type. Since holes in the third region 4 of p type are drawn out directly into the sixth region 17 via the second MOSFET 23 of the short channel, the transistor Qnpn made up of the second region 3, the third region 4, and the fifth region 16 is turned off. This results in a transistor state in which the thyristor operation is lost and only the transistor Qpnp operates. This state is the IGBT operation state in which electrons are injected into the second region 3 by the first MOSFET 12. In this state, as shown in FIG. 3B, electron current (solid line) for injecting electrons flows into the fifth region 16 from the second region 3 via the channel of the first MOSFET 12 on the well end of the third region 4 and along the electron current, the hole current indicated by the broken line passes through just below the fifth region 16 from the second region 3 via the well end of the third region 4 and flows into the sixth region 17 via the channel of the second MOSFET 23, which is just below the gate electrode 21.

After this, if the first gate electrode 10 is placed at zero or low potential and the first MOSFET 12 is turned off with the second gate electrode 21 remaining at zero or low potential, immediately electron injection stops. Thus, flow of holes into the second region 3 from the first region 2 responding to its also stops, so that the time required for sweeping out the carriers can be shortened, shortening the turn off time.

Figure 4:
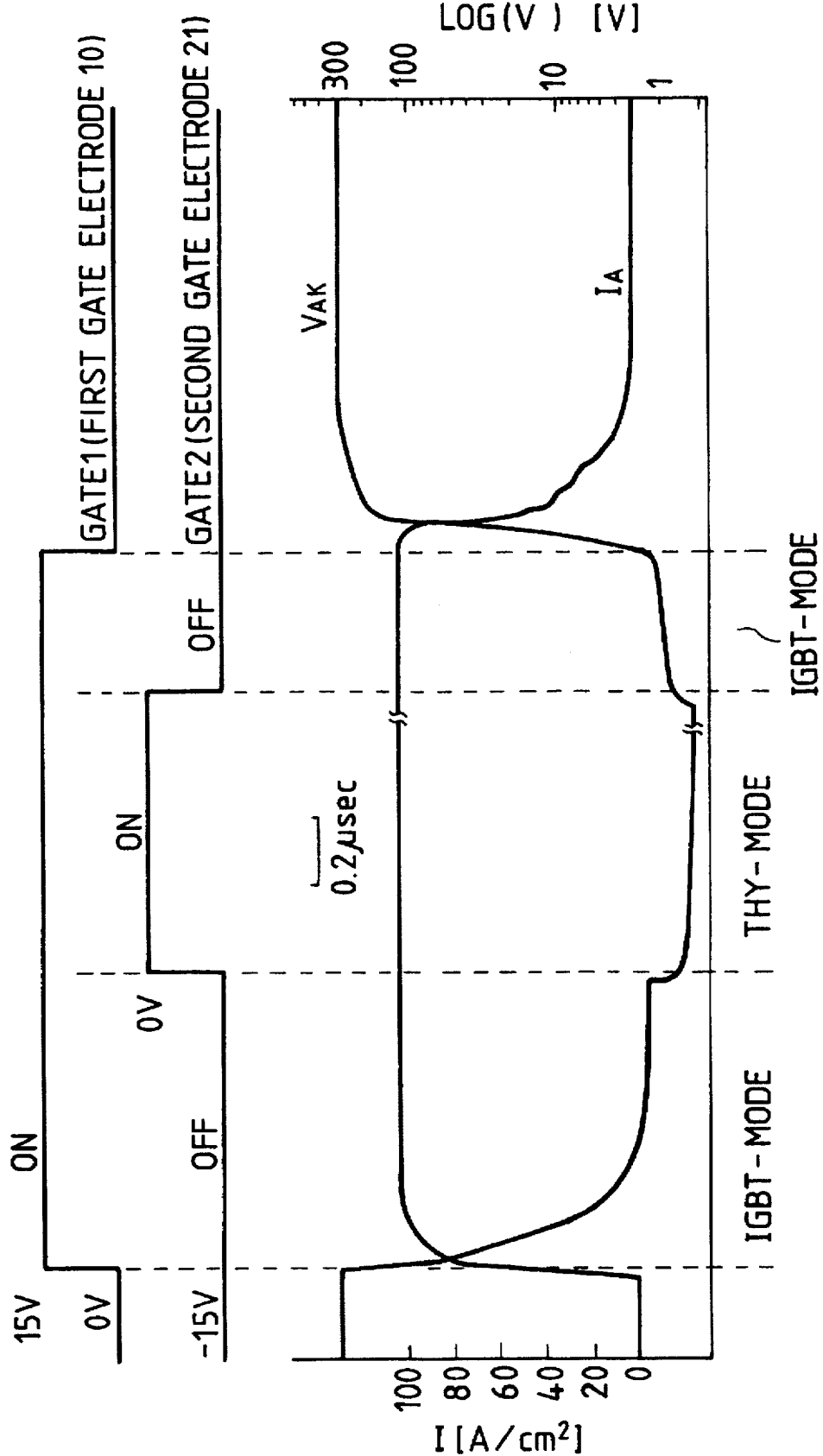
FIG. 4 is a graph showing the relationship between potential applied to first and second gate electrodes and anode-cathode voltage $V_{AK}$ and anode current $I_A$ in the semiconductor device shown in FIG. 1.

FIG. 4 shows the relationship between potential applied to the first and second gate electrodes 10 and 21 and anode-cathode voltage $V_{AK}$ and anode current $I_A$. When 0 V is applied to the first gate electrode 10 and −15 V is applied to the second gate electrode 21, the first MOSFET 12 is off, but the second MOSFET 23 is on; the thyristor structure is in a turn off state. Here, the anode current $I_A$ is zero and the anode-cathode voltage $V_{AK}$ is about 300 V. As described above, if high potential (15 V) is applied to the first gate electrode 10 with −15 V remaining applied to the second gate electrode 21, the first MOSFET 12 is turned on and the semiconductor device makes the transition to the IGBT mode in which electrons are injected and only the transistor Qpnp operates. The anode current $I_A$ instantaneously becomes saturated and the anode-cathode voltage (on voltage) $V_{AK}$ becomes saturated to about 3 V in about 0.2 μs.

If from the IGBT mode, 0 V is applied to the second gate electrode 21 and the second MOSFET 23 is turned off, the effect of drawing out holes stops, thus the transistor Qnpn is turned on, causing the semiconductor device to be completely turned on and instantaneously make the transition to the thyristor mode. The anode-cathode voltage (on voltage) $V_{AK}$ in the thyristor mode indicates a low value of about 1 V. Next, if −15 V is applied to the second gate electrode 21 and the second MOSFET 23 is turned on, holes are drawn out, thus instantaneously the transition to the IGBT mode is made and the anode-cathode voltage (on voltage) $V_{AK}$ becomes about 3 V. After this, if 0 V is applied to the first gate electrode 10 and the first MOSFET 23 is turned off, the IGBT operation also stops as fast as about 0.4 μs and the semiconductor device is turned off. The anode current $I_A$ is zero and the anode-cathode voltage $V_{AK}$ becomes about 300 V. Thus, when the semiconductor device is on, it operates at low on voltage like the MCT; when off, it is turned off in short turn off time like the IGBT. Therefore, a power device with low switching loss can also be provided in high-frequency application.

In the embodiment, the second MOSFET 23 for drawing out holes in the third region 4 is of inverse conductivity type to the conductivity type of the first MOSFET 12 and is a double diffusion type MOSFET. This eliminates the need for forming the short-circuit electrode (metal electrode) for converting holes into electrons as electrode wiring on the first layer as in the conventional structure, so that holes can be drawn out directly at MOSFET. Thus, difficultly in forming fine electrodes and the 2-layer structure of electrode wiring can be avoided. Further, since the second MOSFET 23 is a double diffusion type MOSFET, the channel can be shortened and the second MOSFET 23 itself can be put into low on-state resistance, thereby hastening the hole drawing out speed and increasing the turn off speed. Characteristic variations of the second MOSFET 23 can also be suppressed. Further, the latch-up immunity amount can be increased so that the controllable current capacity can be increased.

Figure 5:
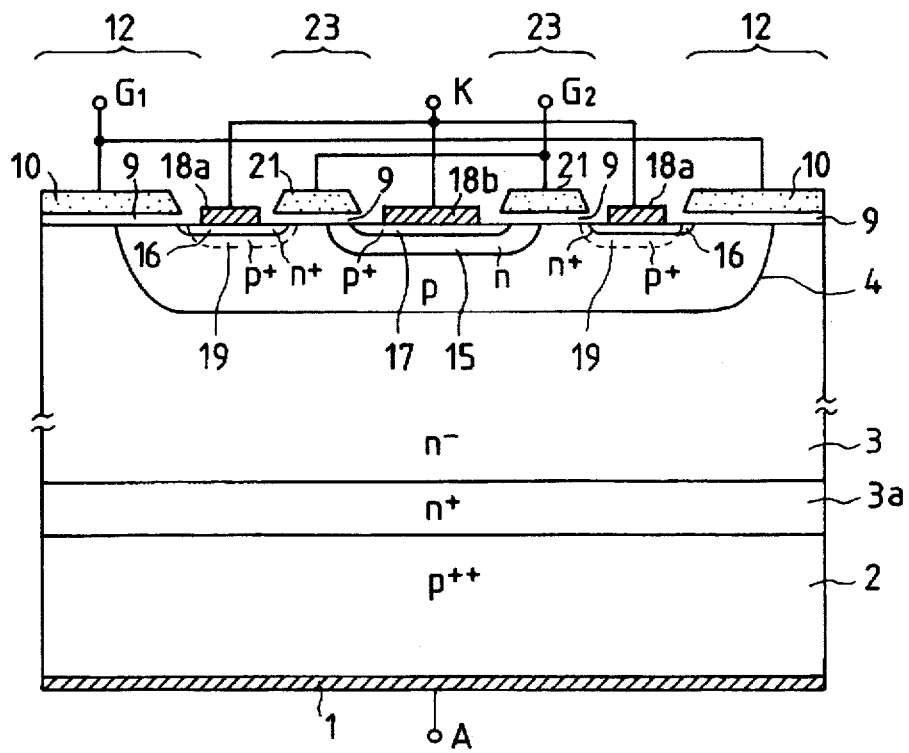
FIG. 5 is a sectional view showing the structure of a semiconductor device with a double gate according to a second embodiment of the invention.

Embodiment 2:

FIG. 5 is a sectional view showing the structure of a semiconductor device including a double gate according to a second embodiment of the invention. The semiconductor structure of the embodiment differs from that of the first embodiment in that a seventh region 19 of high-density p⁺ type like a shallow well is formed just below a fifth region 16 and that a third region 4 remains just below the seventh region 19. It should be noted that the well end of the fifth region 16 at the channel side is not covered with the seventh region 19.

By the way, in the structure of the first embodiment, the operation mode transition is once made from the thyristor mode to transistor (IGBT) mode, then the transistor mode is turned off, thereby turning off the device; however, it is latched up due to parasitic resistance, etc., and controllable current value cannot be increased. That is, as shown in FIG. 3, the main current flows through the third region 4 below the fifth region 16 in any operation mode. Particularly, the passage of the hole current indicated by the broken line in the transistor mode shown in FIG. 3B enters the third region 4 from the well end thereof along the electron current passage, flows through the lower side of the fifth region 16 into the region just below the second gate electrode 21 at the center of the well of the third region 4, and is drawn out into the sixth region 17 via the channel of the second MOSFET 23. Since diffusion resistance (base resistance $R_B$) is parasitic in the third region 4 below the fifth region 16, if excessive current for drawing out holes flows into the parasitic resistance, voltage drop occurs, causing trigger current of the npn-type transistor Qnpn consisting of the second region 3 of n⁻ type, the third region 4 of p type, and the fifth region 16 of n⁺ type. Even if the second MOSFET 23 is turned on and holes are drawn out for attempting to turn on the transistor Qnpn, it is not turned off, resulting in the latch-up state.

Then, to suppress the latch-up in the transistor mode (to increase the controllable current until the latch-up occurs), in the second embodiment, the seventh region 19 of high-density p⁺ type like a shallow well, which does not penetrate the third region 4, is formed just below the fifth region 16 in order to reduce the parasitic resistance value below the fifth region 16. Even though a large amount of the hole draw-out current flows by making the resistance of the base resistor $R_B$ low, the npn type transistor Qnpn becomes difficult to latch up, thereby being capable of increasing the controllable current value.

Figure 6:
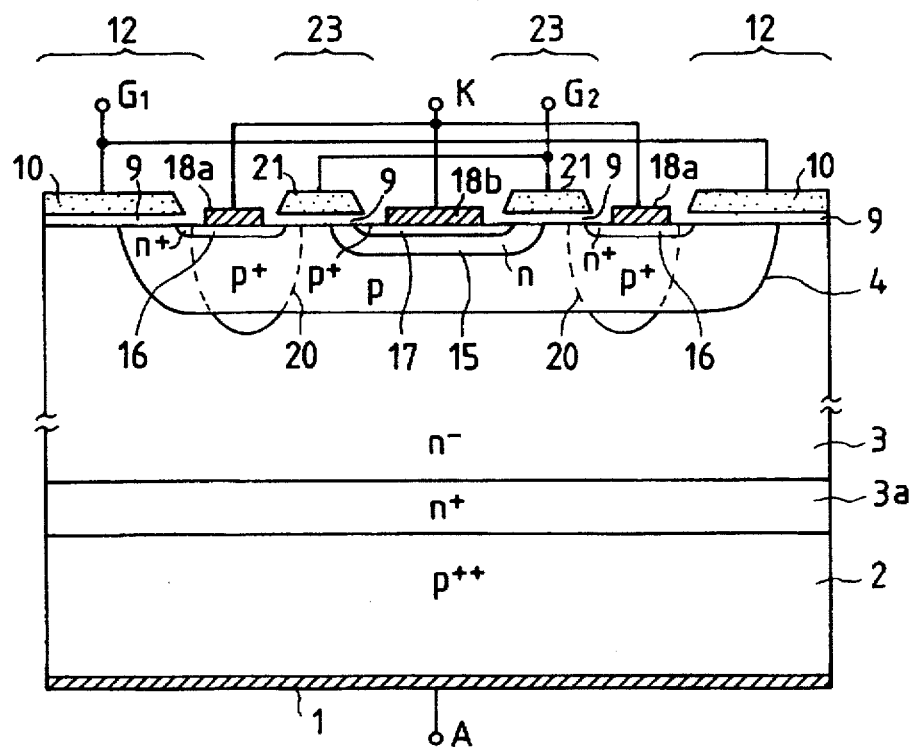
FIG. 6 is a sectional view showing the structure of a semiconductor device with a double gate according to a third embodiment of the invention.

Embodiment 3:

FIG. 6 is a sectional view showing the structure of a semiconductor device including a double gate according to a third embodiment of the invention. In the third embodiment, a seventh region 20 of high-density p⁺ type like a deep well is formed just below a fifth region 16. It should be noted that the well end of the fifth region 16 at the channel side is not covered with the seventh region 20. Since the seventh region 20 is deep to such a degree that it pierces a third region 4 as compared with the seventh region 19 like a shallow well in the second embodiment, most of hole current in the transistor mode passes through the seventh region 20 like a deep well. Therefore, the parasitic resistance value can be lowered drastically. If the impurity density just below the fifth region 16 is made too high, the on voltage in the thyristor mode will increase. Thus, preferably, the seventh region 19 like a shallow well is formed as in the second embodiment or the impurity density is set properly in the third embodiment within a range of $10^{18}$ to $10^{19}$ cm⁻³.

Figure 7:
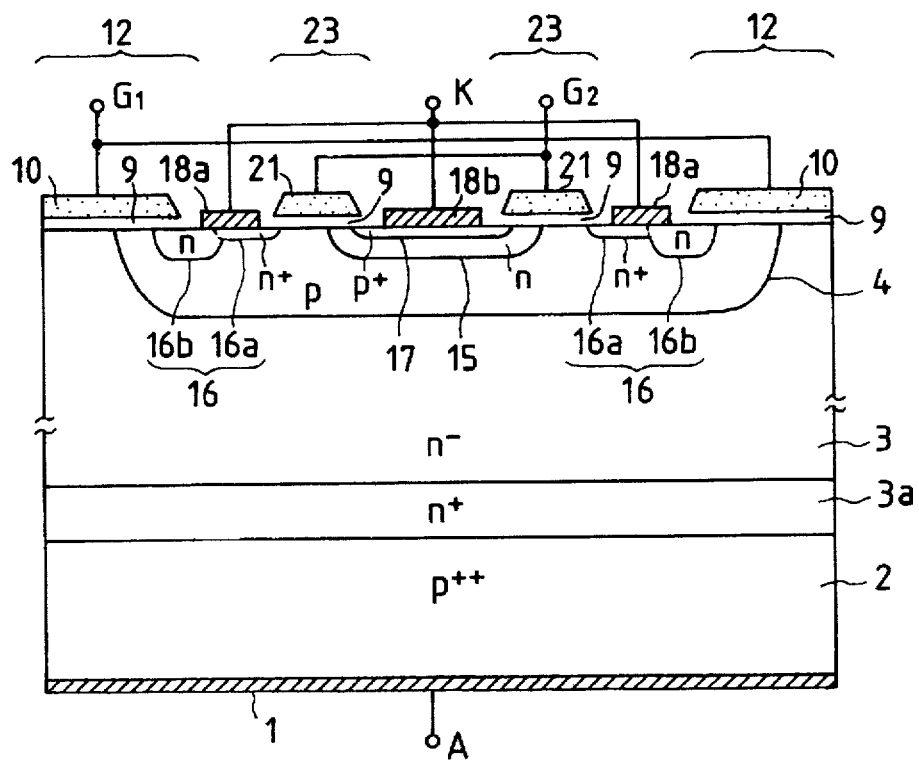
FIG. 7 is a sectional view showing the structure of a thyristor semiconductor device with a double gate according to a fourth embodiment of the invention.

Embodiment 4:

FIG. 7 is a sectional view showing the structure of a thyristor semiconductor device comprising a double gate according to a fourth embodiment of the invention. In the embodiment, a fifth semiconductor region 16 is an overlap region of a shallow n⁺-type inner well region 16a on the side of a gate electrode 21 and a deep n-type outer well region 16b on the side of a gate electrode 10 (well end side). Since the density of the shallow n⁺-type inner well region 16a is higher than that of a third semiconductor region 4 of p type, current amplification factor $h_{FE}$ of an npn-type transistor Qnpn is high. Therefore, the shallow n⁺-type inner well region 16a functions as a substantial cathode region in the thyristor state and the main current flows in the vertical direction via the well bottom. It is important that the density of the n-type outer well region 16b is lower than that of the n⁺-type inner well region 16a; the n-type outer well region 16b need not particularly be deep. At the IGBT operation time, the voltage in the surroundings of the n-type outer well region 16b lowers as compared with that in the surroundings of the n⁺-type inner well region 16a in the third semiconductor region 4 due to voltage drop of diffused resistor $R_B$, and the npn-type transistor Qnpn on the n-type outer well region 16b side is prone to latch up. However, since the density of the deep n-type outer well region 16b is lower than that of the shallow n⁺-type inner well region 16a, the current amplification factor $h_{FE}$ of the npn-type transistor Qnpn is low and the npn-type transistor Qnpn is hard to latch up at the IGBT operation time. Thus, the controllable current capacity can be increased.

Figure 8:
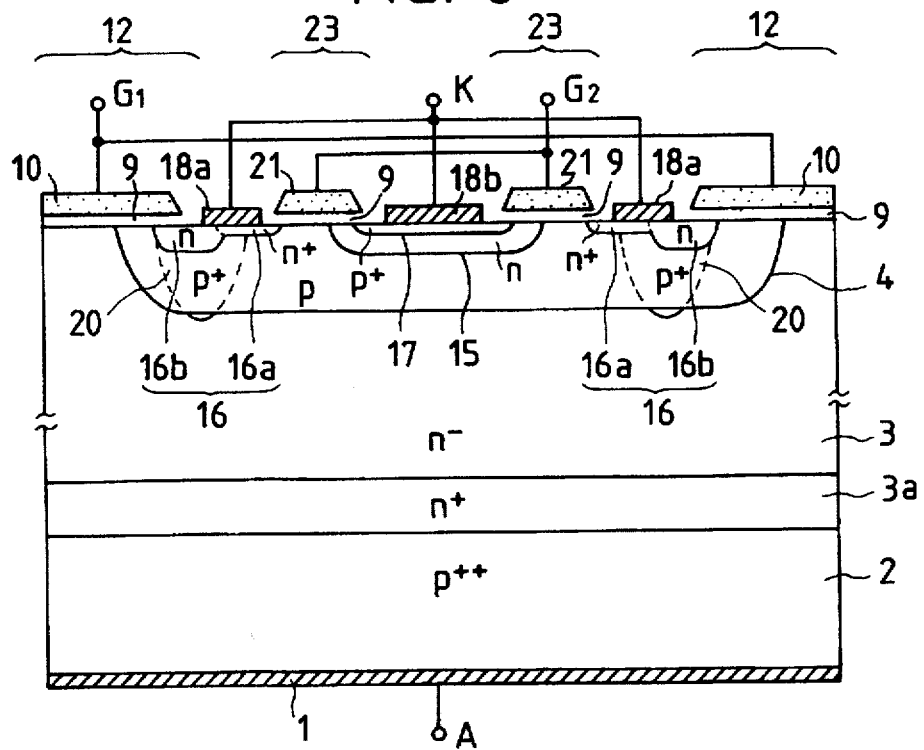
FIG. 8 is a sectional view showing the structure of a thyristor semiconductor device with a double gate according to a fifth embodiment of the invention.

Embodiment 5:

FIG. 8 is a sectional view showing the structure of a thyristor semiconductor device comprising a double gate according to a fifth embodiment of the invention. The embodiment has both the structure of the third embodiment shown in FIG. 6 and that of the fourth embodiment shown in FIG. 7. That is, a fifth semiconductor region 16 is an overlap region of a shallow n⁺-type inner well region 16a on the side of a gate electrode 21 and a deep n-type outer well region 16b on the side of a gate electrode 10, and a seventh semiconductor region 20 like a deep well of p⁺ type is formed just below the fifth semiconductor region 16. Current amplification factor $h_{FE}$ of an npn-type transistor Qnpn is low in the presence of the n-type outer well region 16b, and the parasitic resistance value can be drastically reduced in the presence of the seventh semiconductor region 20 having a high density. Therefore, the latch-up immunity amount can be increased synergistically and the controllable current capacity can be increased. Also in this case, it is important that the n-type outer well region 16b has a low density; it need not particularly be deep.

Figure 9:
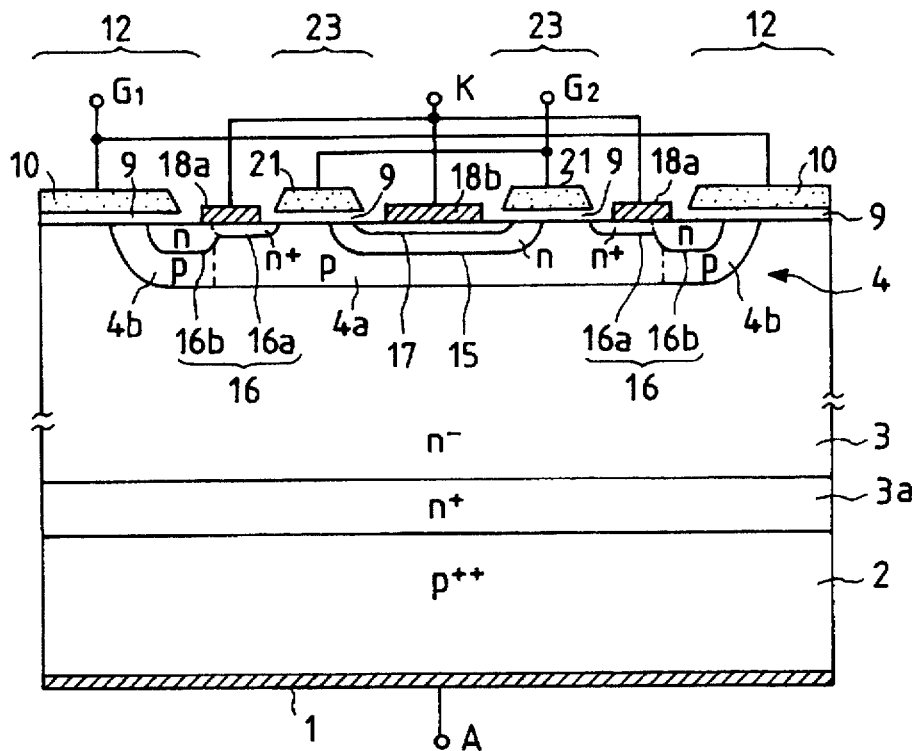
FIG. 9 is a sectional view showing the structure of a thyristor semiconductor device with a double gate according to a sixth embodiment of the invention.

Embodiment 6:

FIG. 9 is a sectional view showing the structure of a thyristor semiconductor device comprising a double gate according to a sixth embodiment of the invention. The embodiment is a modified form of the fifth embodiment, wherein a fifth semiconductor region 16 is an overlap region of a shallow n⁺-type inner well region 16a on the side of a gate electrode 21 and a deep n-type outer well region 16b on the side of a gate electrode 10, and the well end side of a third semiconductor region 4 of p type is formed as a high-density region 4b having a higher density than an inner region 4a. Since current amplification factor $h_{FE}$ of an npn-type transistor Qnpn containing the n⁺-type inner well region 16a is low and the parasitic resistance value can be reduced, the latch-up immunity amount can be increased. However, if the density of the high-density region 4b on the well end side becomes the level of the p⁺-type, the threshold voltage of a first MOSFET increases. Thus, the density needs also be adjusted based on this point.

Figure 10:
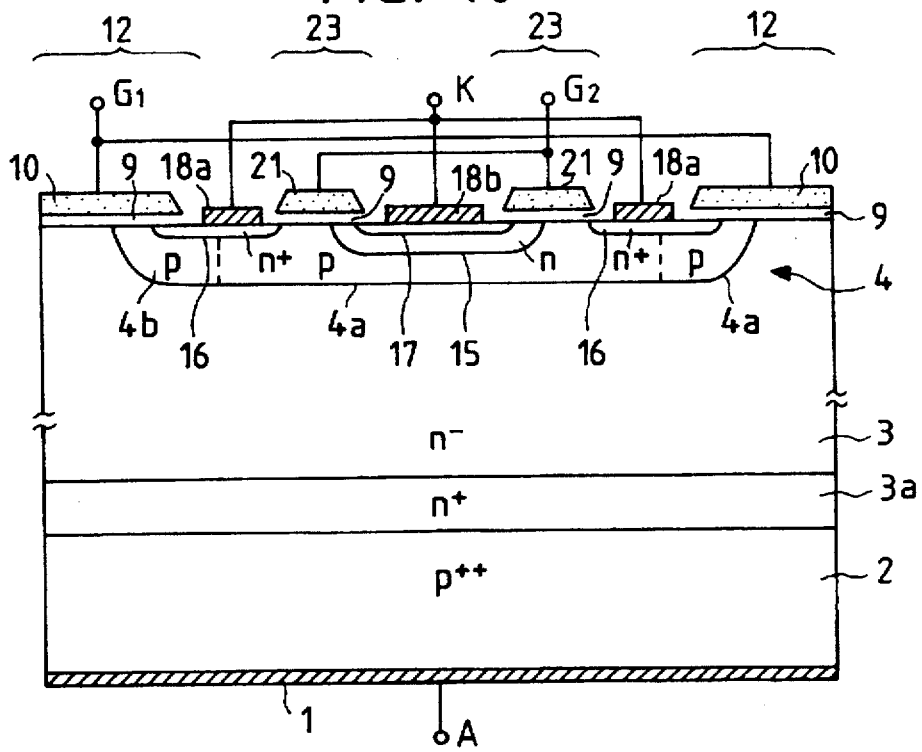
FIG. 10 is a sectional view showing the structure of a thyristor semiconductor device with a double gate according to a seventh embodiment of the invention.

Embodiment 7:

FIG. 10 is a sectional view showing the structure of a thyristor semiconductor device comprising a double gate according to a seventh embodiment of the invention. In the embodiment, while a fifth semiconductor region 16 is made an n⁺-type region, the well end side of a third semiconductor region 4 of p type is formed as a high-density region 4b having a higher density that an inner region 4a. Since the parasitic resistance value of a hole drawing-out current path in the IGBT state can be reduced, the latch-up immunity amount can be increased. Also in the embodiment, if the density of the high-density region 4b on the well end side becomes the level of the $p^+$ type, the threshold voltage of a first MOSFET increases. Thus, the density needs also be adjusted based on this point.

Figure 11:
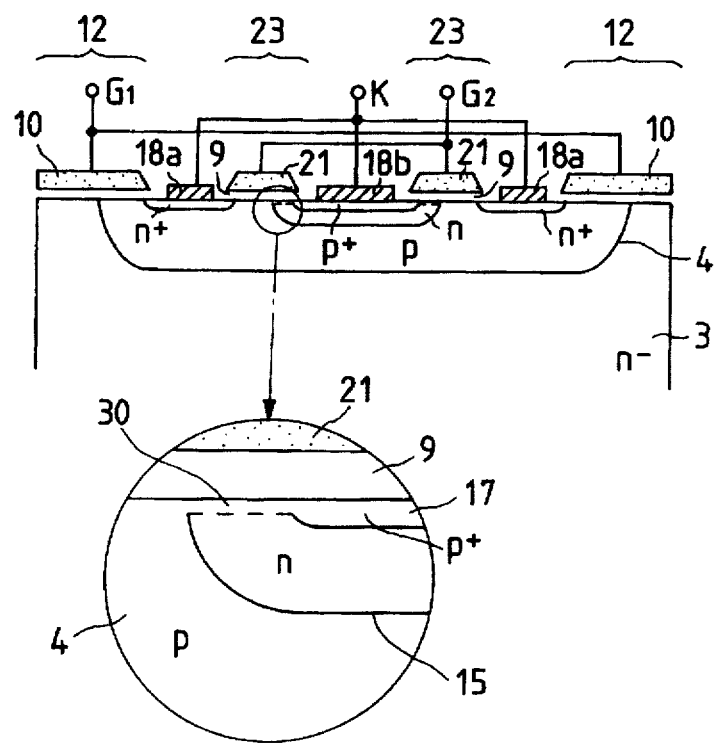
FIG. 11 is a sectional view showing the structure of a semiconductor device with a double gate according to an eighth embodiment of the invention.

Embodiment 8:

FIG. 11 is a sectional view showing the structure of a semiconductor device including a double gate according to an eighth embodiment of the invention. The embodiment is characterized by the fact that a second MOSFET 23 of p channel type is of depletion type structure. A surface p-type region 30 doped with p-type impurities is formed in a surface channel part of a fourth region 15 of n type forming a back gate of double diffusion type MOSFET of the second MOSFET 23 in a state in which no gate voltage is applied.

By the way, in the first to third embodiments, the first MOSFET 12 of enhancement type n channel is turned off at gate voltage 0 V and on at gate voltage 10–15 V. On the other hand, the second MOSFET 23 of enhancement type p channel is turned on at gate voltage −10 V and off at gate voltage 0 V.

Thus, in addition to positive power supply (+10 to 15 V), negative power supply (−10 V) is required as the gate drive circuit. To simplify the gate circuitry configuration, in the fourth embodiment, the surface p-type region 30 is formed for making the second MOSFET 23 the depletion type. Resultantly, the second MOSFET 23 is turned on at gate voltage 0 V and off at gate voltage 10–15 V; it is enabled or disabled exclusively with a first MOSFET 12 with respect to the gate voltage. Therefore, single-power supply operation is enabled. Of course, the first MOSFET 12 may be made the depletion type.

Figure 12:
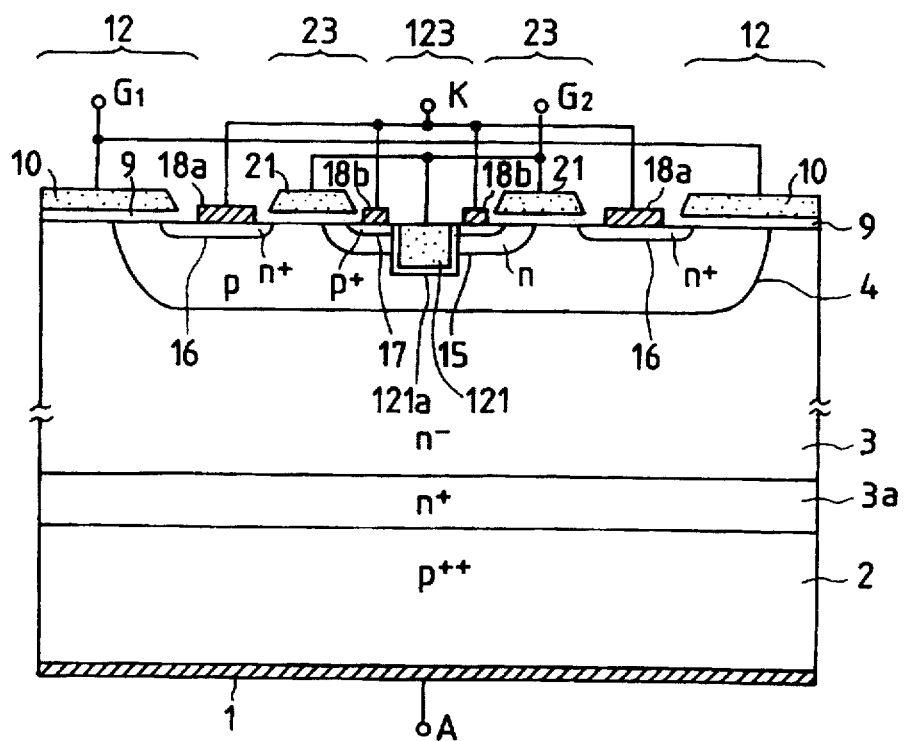
FIG. 12 is a sectional view showing the structure of a thyristor semiconductor device with a double gate according to a ninth embodiment of the invention.

Embodiment 9:

FIG. 12 is a sectional view showing the structure of a thyristor semiconductor device comprising a double gate according to a ninth embodiment of the invention. In the embodiment, a second gate electrode 121 of polycrystalline silicon is embedded via a gate insulation film 121a in a trench made in the center of a sixth semiconductor region 17, forming a second MOSFET 123 of trench gate type. In the IGBT state, vertical channels on both side faces of the gate electrode 121 of the trench gate type MOSFET 123 increase in addition to a horizontal channel just below a gate electrode 21 on a hole drawing-out path leading to a second cathode electrode 18b. Thus, the channel width increases as a whole and the hole drawing out force strengthens, speeding up the turn off time. Since the hole drawing out current is dispersed just below a fifth semiconductor region 16, the voltage drop caused by parasitic resistance can also be suppressed and the latch-up immunity amount can be increased.

Figure 13:
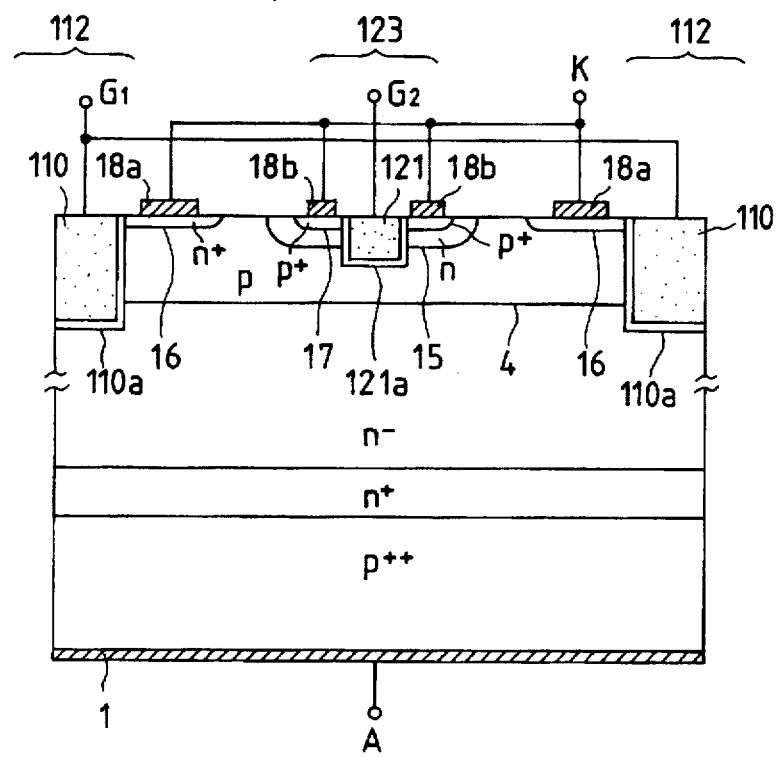
FIG. 13 is a sectional view showing the structure of a thyristor semiconductor device with a double gate according to a ninth embodiment of the invention.

Embodiment 10:

FIG. 13 is a sectional view showing the structure of a thyristor semiconductor device comprising a double gate according to a tenth embodiment of the invention. In the embodiment, only a second MOSFET 123 of trench type can be formed as a hole drawing out MOSFET. Also, a first MOSFET 112 of trench gate type is formed as an electron injection MOSFET. The trench type MOSFET 112 comprises a first gate electrode 110 of polycrystalline silicon embedded via a gate insulation film 110a in a trench made in the center of a fifth semiconductor region 16. Since the first MOSFET 112 shown in FIG. 12 is of a vertical DMOS (VDOS) structure, electron flow is diverted from a horizontal channel just below a gate electrode 10 to the vertical direction, the gate length of the gate electrode 10 needs to be made about 20–30 μm wide for the purpose of reducing pinch resistance of a drain drift part. However, if the trench gate type MOSFET 122 is adopted as in the tenth embodiment, an electron current flows in the vertical direction from the beginning along the side wall of the gate electrode 110, so that the gate electrode 110 can be made fine; for example, the gate length needs only to be about 2–3 μm. Since on resistance lowers, the switching loss can be reduced.

Figure 14:
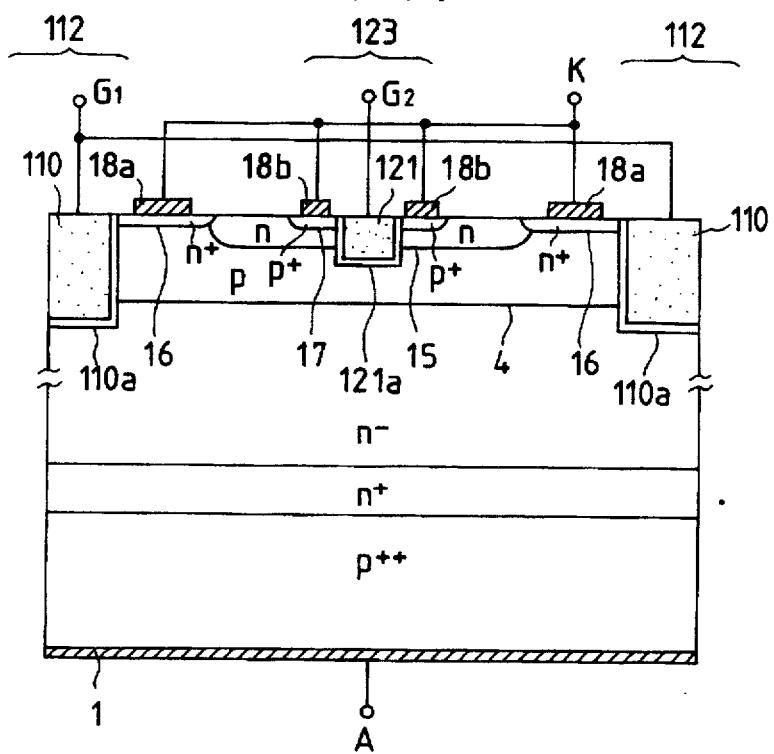
FIG. 14 is a sectional view showing the structure of a thyristor semiconductor device with a double gate according to an eleventh embodiment of the invention.

Embodiment 11:

FIG. 14 is a sectional view showing the structure of a thyristor semiconductor device comprising a double gate according to an eleventh embodiment of the invention. In the embodiment, a fourth semiconductor region 15 of n type in the structure of the tenth embodiment is connected to a fifth semiconductor region 16 of $n^+$ type in overlapped relation. Thus, in the thyristor state, not only fifth semiconductor region 16 of $n^-$ type, but also the fourth semiconductor region 15 of n type functions as a cathode region for increasing the cathode current capacity.

Figure 15:
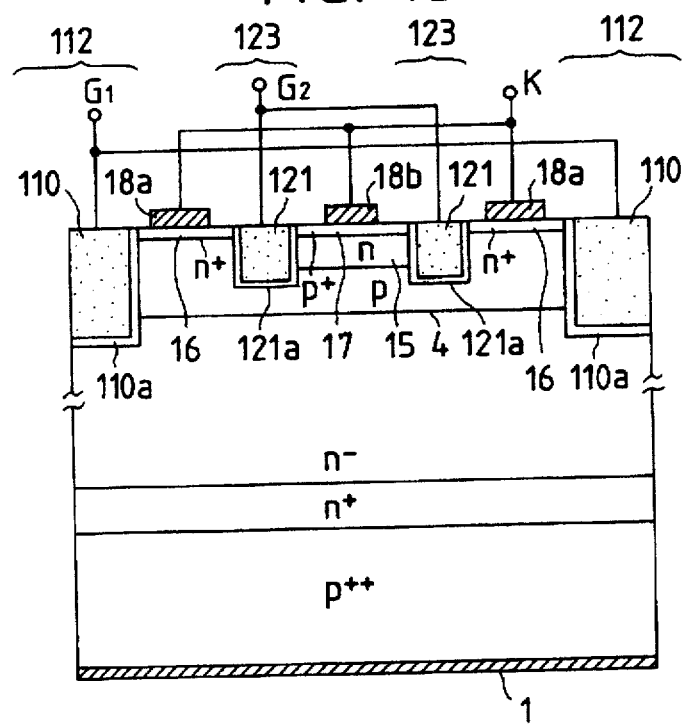
FIG. 15 is a sectional view showing the structure of a thyristor semiconductor device with a double gate according to a twelfth embodiment of the invention.

Embodiment 12:

FIG. 15 is a sectional view showing the structure of a thyristor semiconductor device comprising a double gate according to a twelfth embodiment of the invention. In the embodiment, a trench gate type MOSFET is used as a second MOSFET 123 and gate electrodes 121 and 121 are placed facing each other. A fourth semiconductor region 15 of n type is formed on the surface of a third semiconductor region 4 of p type sandwiched between the gate electrodes 121 and 121 and a sixth semiconductor region 17 of $p^-$ type (or $p^+$ type) is formed on the surface of the fourth semiconductor region 15. In the embodiment, the distance between the gate electrodes 121 and 121 can be shortened, so that the plane occupation percentage of a fifth semiconductor region 16 can be enlarged and the cathode current capacity can be increased.

EMBODIMENT 13

Figure 16:
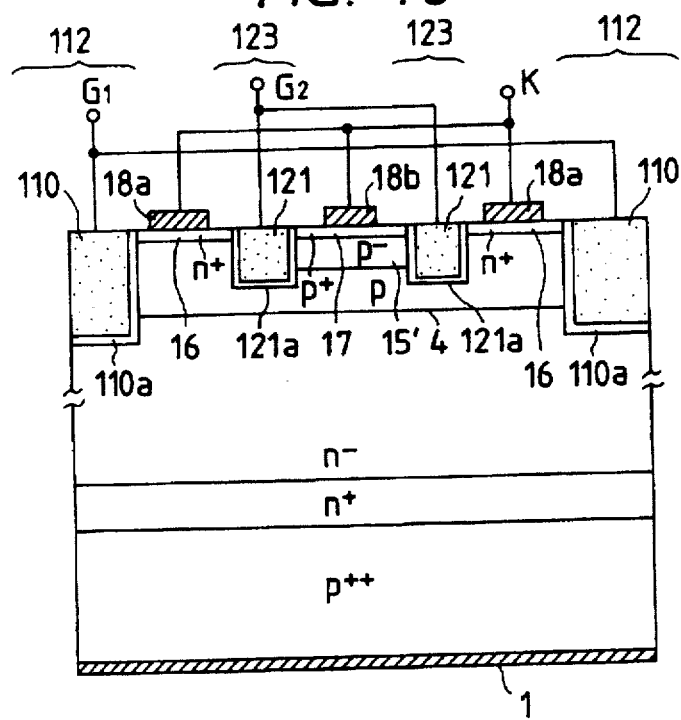
FIG. 16 is a sectional view showing the structure of a thyristor semiconductor device with a double gate according to a thirteenth embodiment of the invention.

FIG. 16 is a sectional view showing the structure of a thyristor semiconductor device comprising a double gate according to a thirteenth embodiment of the invention. In the embodiment, the fourth semiconductor region 15' in the twelfth embodiment 12 shown in FIG. 15 is epitaxial-grown as a $p^-$-type region. A sixth semiconductor region 17 of $p^-$ type (or $p^+$-type) is formed on the surface of the fourth semiconductor region 15'. When a zero voltage is applied to a gate electrode 121, a trench gate type MOSFET 123 is on, but if a voltage higher than the zero voltage is applied to the gate electrode 121, the fourth semiconductor region 15' of $p^-$-type becomes depleted and the trench gate type MOSFET 123 is turned off. That is, the trench gate type MOSFET 123 for drawing out holes is of depletion type. Therefore, a control system of the semiconductor device can be operated with a single power supply. Of course, a first MOSFET 112 may be made a depletion type.

EMBODIMENT 14

Figure 17A:
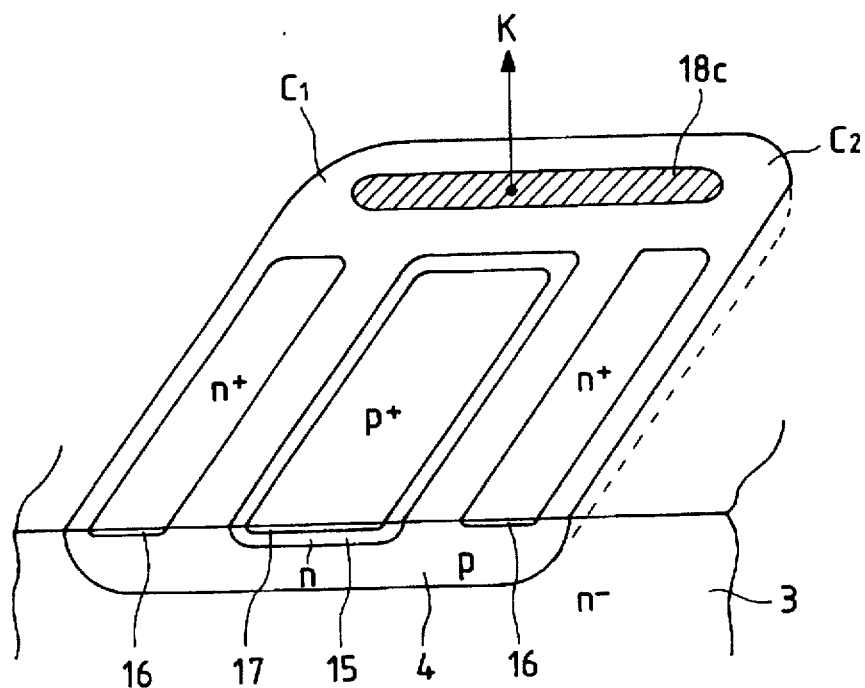
FIG. 17A is a diagrammatic illustration showing a cell pattern of a semiconductor device with a double gate according to a fourteenth embodiment of the invention.
Figure 17B:
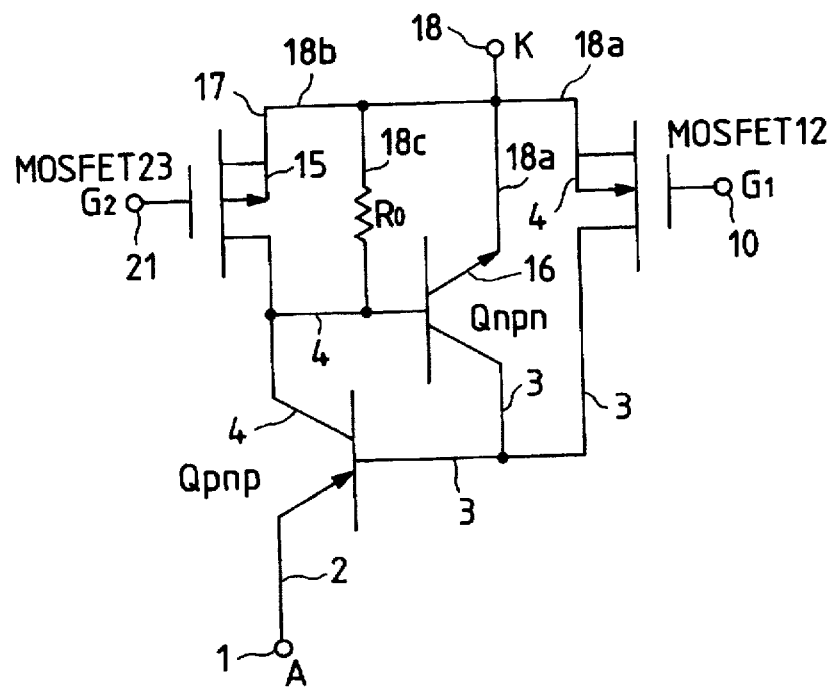
FIG. 17B is a circuit diagram showing its equivalent circuit of the semiconductor device shown in FIG. 17A.

FIG. 17A is a diagrammatic illustration showing a cell pattern of a semiconductor device including a double gate according to a fourteenth embodiment of the invention. The cell of the semiconductor device including a double gate is provided by forming a third region 4 as a stripe-like well in a second region 3. Fifth regions 16 are formed as stripe-like wells on both ends in the width direction of the well in the third region 4 of the stripe-like well and a fourth region 15 and a sixth region 17 are formed as a stripe-like well of double diffusion type at the center in the third region 4 of the stripe-like well. On the surface of the end in the length of the third region 4, a short-circuit electrode 18c is formed coming in conductive contact with it. The cathode electrode 18c conducts with cathode electrodes 18a and 18b (see FIG. 1) coming in conductive contact with the fifth region 16 and the sixth region 17 as electrode wiring of the first layer. If wiring resistance exists between the short-circuit electrode 18c and cathode terminal K and an independent resistor is inserted, the semiconductor device of the embodiment becomes an equivalent circuit shown in FIG. 17B. The equivalent circuit in FIG. 17B differs from the equivalent circuit shown in FIG. 2 in that a short-circuit resistor $R_0$ is inserted between the base and emitter of a transistor Qnpn consisting of the second region 3, the third region 4, and the fifth region 16.

By the way, since electrostatic focusing occurs in the corners in the third region 4 of the well within the same cell, even if a second MOSFET 23 is turned on for drawing out holes, the transistor Qnpn remains on and is prone to latch up. Since it is prone to latch up in the corners, controllable current capacity cannot be increased. Then, in the embodiment, the short-circuit resistor $R_0$ is provided to draw out holes directly from the corners (ends) in the third region 4 together with the second MOSFET 23. On the other hand, holes also leak out via the short-circuit resistor $R_0$ from the corners in the third region 4 in the thyristor operation mode in which a first MOSFET 12 is on and the second MOSFET 23 is off; the thyristor operation is hard to perform. To enrich the hole density when the first MOSFET 12 is on and the second MOSFET 23 is off, in the embodiment, the third region 4 is shaped like stripes for reducing the corner occupation area ratio, and the short-circuit electrode 18c is formed in the width direction extending over corners $C_1$ and $C_2$ of the end in the length direction. FIG. 17A shows only the half of the third region 4 like stripes; another short-circuit electrode 18c is also formed on the oppose end. In the thyristor mode, longer end part in the width reaction of the third region 4 would enable current capacity to be provided. Hole leakage on the end where the short-circuit electrode 18c is formed does not relatively cause a problem. In the IGBT mode, holes at the corners $C_1$ and $C_2$ are drawn out directly via the short-circuit electrode 18c at the end of the length direction of the stripes, so that base current of the transistor Qnpn can be lessened, preventing latch up. Resultantly, controllable current capacity can be increased. If the short-circuit resistor $R_0$ is not provided, when anode-cathode voltage is applied with the first and second MOSFETs 12 and 23 remaining off, the pnpn-structure thyristor latches up when blocking voltage is exceeded. Therefore, the second MOSFET 23 is turned on before the anode-cathode voltage is raised. However, since the embodiment provides the short-circuit resistor $R_0$, if anode-cathode voltage is applied with the first and second MOSFETs 12 and 23 remaining off, current leaks into the cathode via the short-circuit resistor $R_0$, so that the transistor Qnpn is hard to turn on and latch-up can be prevented.

EMBODIMENT 15

Figure 18:
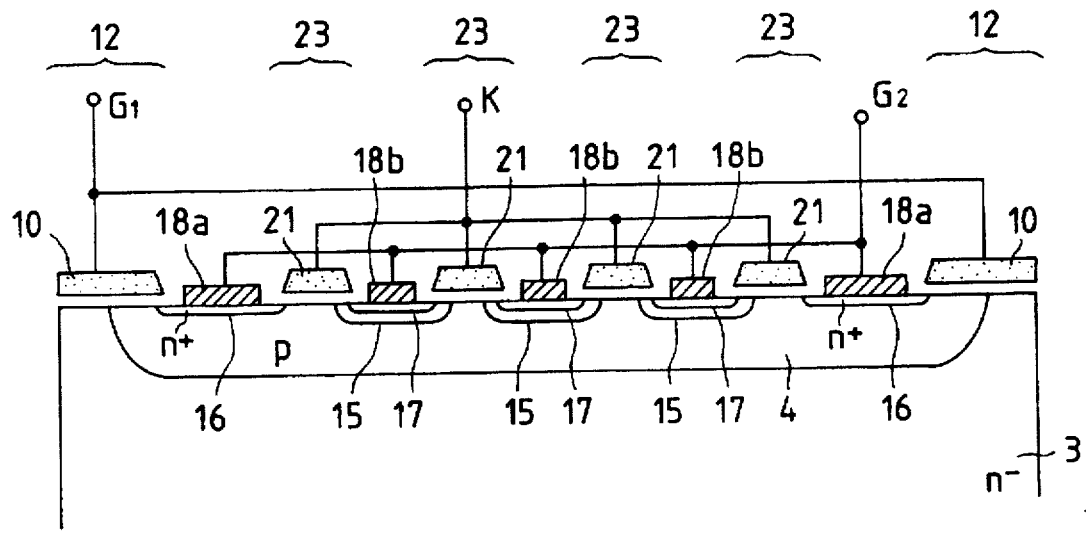
FIG. 18 is a sectional view showing the structure of a semiconductor device with a double gate according to a fifteenth embodiment of the invention.

FIG. 18 is a sectional view showing the structure of a semiconductor device including a double gate according to a fifteenth embodiment of the invention. The embodiment provides a structure where a large number of second MOSFETs 23 for drawing out holes from within a third region 4 at the IGBT operation time are disposed at the center of a well of the third region 4. That is, three fourth isolated regions 15 are formed between fifth regions 16 and 16 formed on both ends of the well of the third region 4, and sixth regions 17 are formed thereon. Four second gate electrodes 21 are disposed via a gate insulating film. When first MOSFETs 12 are on and the second MOSFETs 23 are off, the thyristor operation starts in the portion just below the fifth regions 16 on the both ends of the well of the third region 4, and spreads to the well center. Thus, if the area ratio of first gate electrodes 10 in the cell is low, sufficient thyristor operation is performed. Then, in the embodiment, a large number of distributed second MOSFETs are provided at the center for efficiently preventing latch-up for distributively drawing out holes, thereby increasing controllable current.

EMBODIMENT 16

Figure 19:
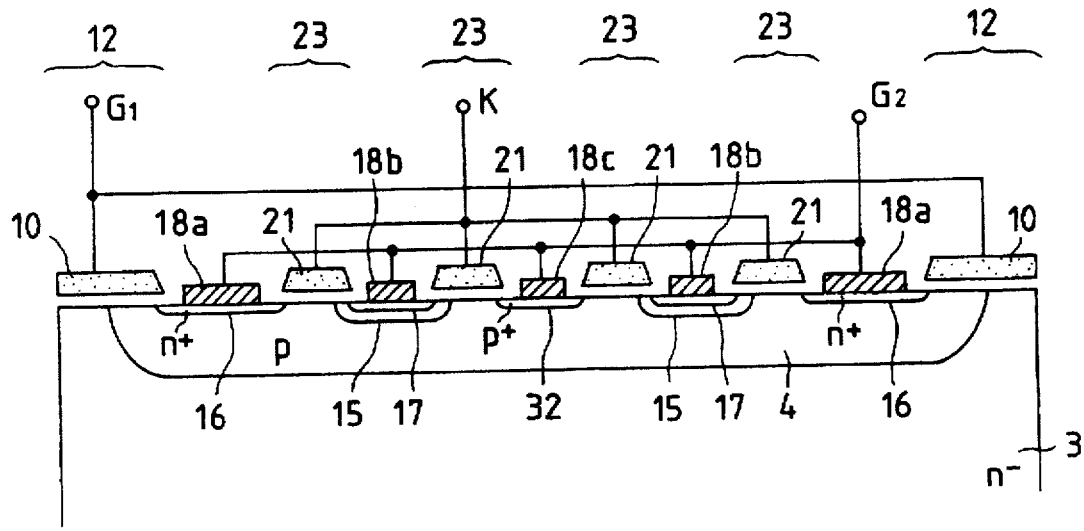
FIG. 19 is a sectional view showing the structure of a semiconductor device with a double gate according to a sixteenth embodiment of the invention.

FIG. 19 is a sectional view showing the structure of a semiconductor device including a double gate according to a sixteenth embodiment of the invention. Like the seventh embodiment, the sixteenth embodiment provides a structure where a large number of second MOSFETs 23 are disposed at the center of a well of a third region 4 for drawing out holes from within the third region 4 at the IGBT operation time. A $p^+$ type contact region 32 of $p^+$ type not covered with a fourth region 15 is formed at the center of the well. It is used as a contact region of a short-circuit electrode 18c with a second region 3. Thus, the $p^+$ type contact region 32 directly draws out holes in the second region 3 not via transistor at the IGBT operation time; the hole drawing out force is strong as compared with that in the fifteenth embodiment.

EMBODIMENT 17

Figure 20:
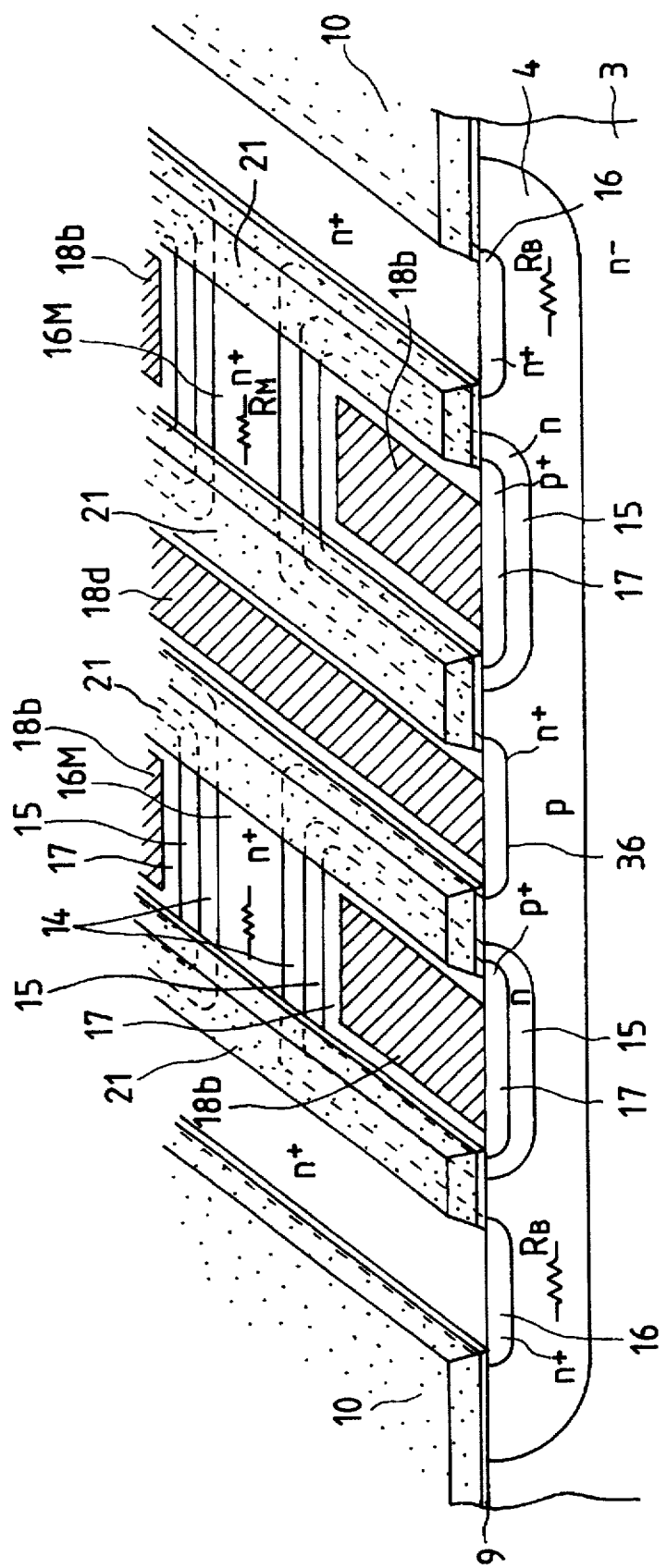
FIG. 20 is a schematic drawing showing the structure of a thyristor semiconductor device with a double gate according to a seventeenth embodiment of the invention.
Figure 21:
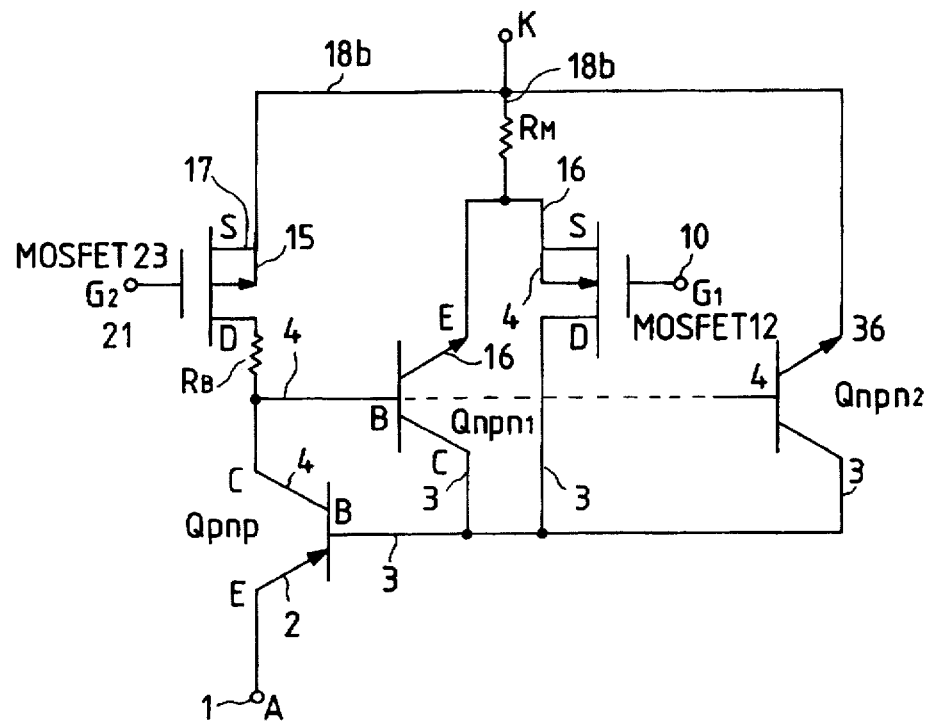
FIG. 21 is a circuit diagram showing its equivalent circuit of the semiconductor device shown in FIG. 20.

FIG. 20 is a schematic drawing showing the structure of a thyristor semiconductor device comprising a double gate according to a seventeenth embodiment of the invention. In the embodiment, an eighth semiconductor region 36' of $n^-$ type like a stripe is also formed in the portion sandwiched between second gate electrodes 21 and 21 like stripes at the center, and a fifth semiconductor region 16 on the well end side of a third semiconductor region 3 and the eighth semiconductor region 36' at the center are connected via an $n^-$-type narrow couple diffusion layer 16M. A cathode electrode 18d comes in conductive contact with the eighth semiconductor region 36' at the center. A diffused resistor $R_M$ is parasitic on a current path from the fifth semiconductor region 16 on the well end side via the couple diffusion layer 16M and the eighth semiconductor region 36' at the center to the cathode electrode 18d. Thus, in an equivalent circuit to the device, the diffused resistor $R_M$ intervenes between an emitter E of a transistor Qnpn and the cathode electrode 18d, as shown in FIG. 21. When a current flows into a first MOSFET 12 in the IGBT state, the base voltage of the transistor Qnpn becomes higher due to the voltage drop of a diffused resistor $R_B$ in a third semiconductor region 4, but the emitter voltage of the transistor Qnpn also becomes higher due to the voltage drop of the diffused resistor $R_M$, thus the forward voltage of the fifth semiconductor region 16 on the well end side and the third semiconductor region 4 just below it does not become relatively higher. Therefore, latch-up of the transistor Qnpn can be suppressed and the controllable current capacity can be increased. Of course, it also contributes to an increase in the current capacity because a cathode current flows via the bottom of the eighth semiconductor region 36' at the center at the thyristor operation time.

EMBODIMENT 18

Figure 22:
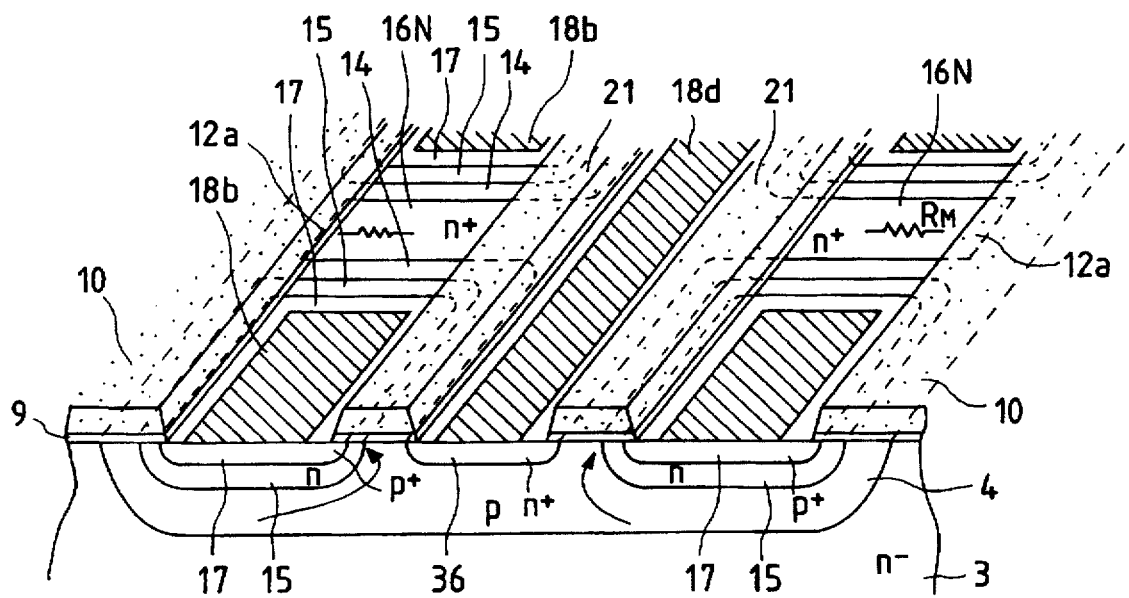
FIG. 22 is a schematic drawing showing the structure of a thyristor semiconductor device with a double gate according to an eighteenth embodiment of the invention.

FIG. 22 is a schematic drawing showing the structure of a thyristor semiconductor device comprising a double gate according to an eighteenth embodiment of the invention. In the embodiment, an eighth semiconductor region 36' of n⁻ type like a stripe is formed in the portion sandwiched between two second gate electrodes 21 like stripes at the center, and a double diffusion structure of a fourth semiconductor region 15 and a sixth semiconductor region 17 is formed in the portion sandwiched between a first gate electrode 10 and a second gate electrode 21. A MOS part 12a forming a part of a first MOSFET 12 for electron injection is the tip of an n⁺-type overhanging region 16N just below the first gate electrode 10 from an eighth semiconductor region 36 at the center. As in the seventeenth embodiment, since a diffused resistor $R_M$ exists in the overhanging region 16N, a transistor Qnpn is hard to latch up in the IGBT state. Since hole drawing out current flows via the outside just below the second gate electrode 21 as indicated by the arrow, the path length can be shortened. Therefore, the value of a diffused resistor $R_B$ in a third semiconductor region 4 can be reduced and the controllable current capacity can be increased as compared with that in the seventeenth embodiment.

EMBODIMENT 19

Figure 23A:
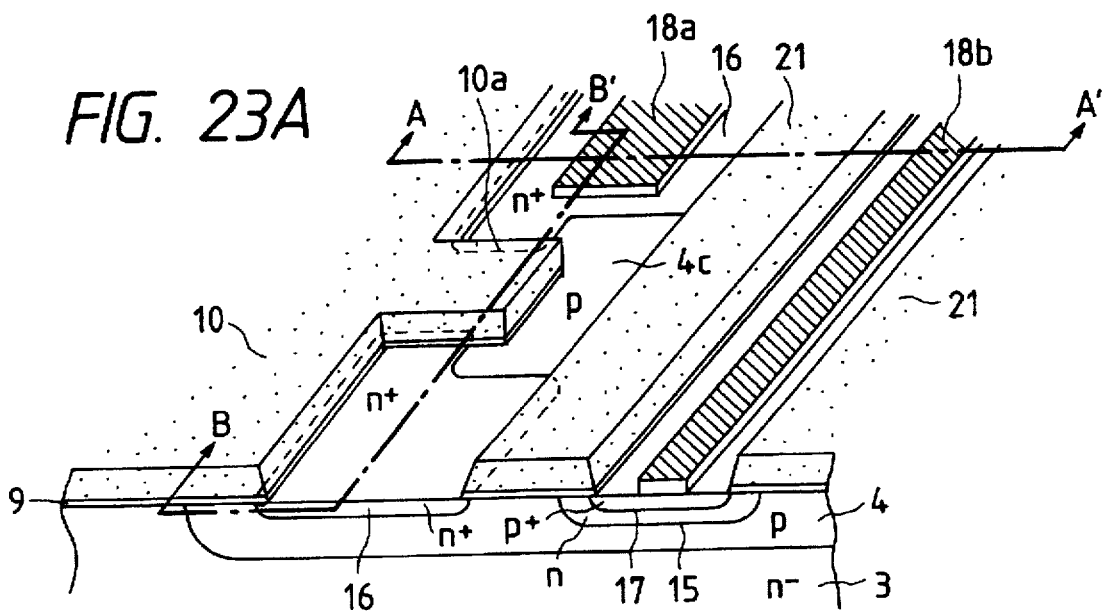
FIG. 23A is a schematic drawing showing the structure of a thyristor semiconductor device with a double gate according to a nineteenth embodiment of the invention.
Figure 23B:
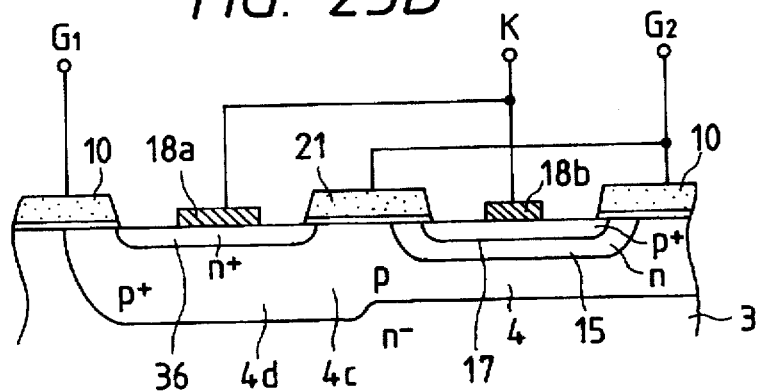
FIG. 23B is a perspective view showing the semiconductor device cut along a line A-A' in FIG. 23A.
Figure 23C:
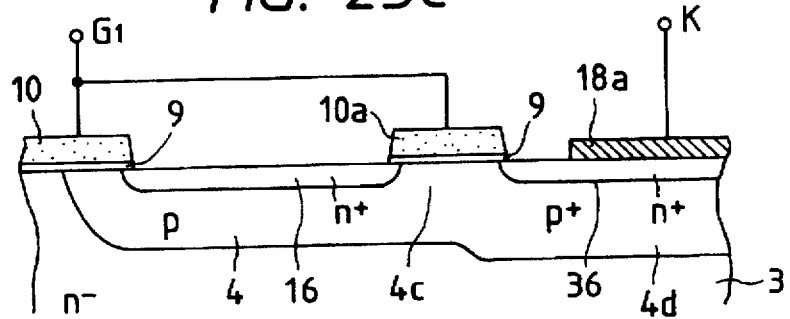
FIG. 23C is a perspective view showing the semiconductor device cut along a line B-B' in FIG. 23A.

FIG. 23A is a schematic drawing showing the structure of a thyristor semiconductor device comprising a double gate according to a nineteenth embodiment of the invention. In the embodiment, a fifth semiconductor region 16 of n⁺-type in the portion sandwiched between a first gate electrode 10 and a second gate electrode 21 is separated by a separation layer 4c of a third semiconductor region 4 of p type. An overhanging electrode part 10a of the first gate electrode 10 extends over the separation layer 4c via gate oxide film 9. A cathode electrode 18a comes in conductive contact with an eighth semiconductor region 36, one of the regions into which the fifth semiconductor region 16 is separated by the p-type separation layer 4c. The eighth semiconductor region 36 with which the cathode electrode 18a comes in conductive contact is formed on a third semiconductor region 4d of p⁺ type. Therefore, as shown in FIG. 23B, the third semiconductor region 4d of p⁺ type, which is at a high density, is just below the gate electrode 10 along line A—A' and even if a high voltage is applied to the gate electrode 10, a channel inversion layer is not formed. However, as shown in FIG. 23C, the p-type separation layer 4c is just below the overhanging electrode part 10a of the gate electrode 10 along line B-B' and if a high voltage is applied to the gate electrode 10, a channel inversion layer is formed below the overhanging electrode part 10a. The overhanging electrode part 10a forms a path switching MOS part. If the voltage applied to the first gate electrode 10 is lowered at the turn off time, the channel inversion layer just below the overhanging electrode part 10a is lost. Thus, an npn-type transistor Qnpn consisting of regions 3 and 4 and the region 16 with which the cathode electrode 18a comes in contact is separated, so that latch-up can be eliminated. npn-type transistor Qnpn consisting of the region 3, the p⁺-type region 4d, and the eighth semiconductor region 36 with which the cathode electrode 18a comes in contact is low in current amplification factor $h_{FE}$ and therefore does not operate even with an excessive current. Particularly, the overhanging electrode part 10a in the embodiment uses a part of the gate electrode 10, so that reduction in the number of manufacturing steps and a fine pattern are enabled.

EMBODIMENT 20

By the way, the chip layout of the semiconductor device comprising the double gate according to the first embodiment has a first gate pad 51 for a first MOSFET 12 formed at the margin center of one long side of a semiconductor chip 50, a second gate pad 52 for a second MOSFET 23 formed at the margin center of an opposite long side, gate wires (gate runners) 51a and 51b of the first layer of metal (aluminum) wiring formed extending from the first gate pad 51 along the short side to the long side, a gate wire (gate runner) 52a of the first layer of metal (aluminum) wiring extending from the second gate pad 52 and arriving at the position just near the first gate pad 51, first gate electrodes 10 like stripes of polycrystalline silicon extending like comb teeth in the long side direction from the gate wires 51a and 51b, and second gate electrodes 21 like stripes of polycrystalline silicon extending like comb teeth in the long side direction from the gate wire 52a, as shown in FIG. 24. The two first gate electrodes 10 and 10 and the two second gate electrodes 11 sandwiched therebetween make up stripe-like cells C1 to Cn.

In the IGBT operation mode of the semiconductor device, as shown in FIG. 9B, an electron current (solid line) for electron injection flows from a second semiconductor region 3 via a channel of a first MOSFET 12 on the well end of a third semiconductor region 4 to a fifth semiconductor region 16, and along the electron current, a hole current (broken line) passes through just below the fifth semiconductor region 16 via the well end of the third semiconductor region 4 from the second semiconductor region 3 and flows into a sixth semiconductor region 17 via a channel of a second MOSFET 23. If a low gate signal is applied to the first gate pad 51 to turn off the first MOSFET 12 at the turn off time, the cell C1 near the gate pad 51 immediately is switched off, but the low gate signal arrives at the cell Cn distant from the gate pad 51 with a delay because of propagation delay (wiring resistance and interwiring capacity). Therefore, at the turn off time, the current of a cell at a short distance first turned off affects cumulatively in sequence a cell at a long distance not yet turned off. Resultantly, an excessive current flows into the MOS part at the tip side of the cell Cn most distant from the gate pad 51 and the part is easily broken. Thus, shortening the turn off time is inconsistent with increasing the controllable current capacity.

Figure 26:
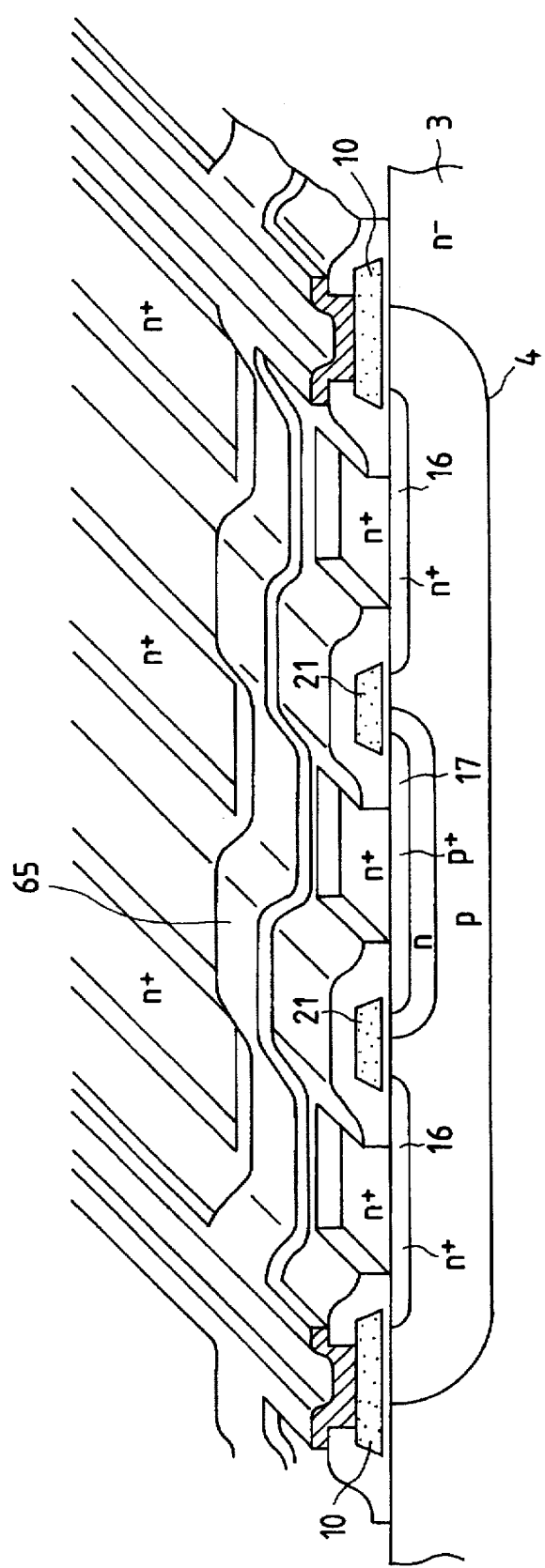
FIG. 26 is a schematic diagram showing the structure of the semiconductor device of FIG. 25.

FIG. 25 is a chip layout of a thyristor semiconductor device comprising a double gate according to a twentieth embodiment of the invention. The chip layout in the embodiment has a first gate pad 61 for a first MOSFET 12 formed at the margin center of one long side of a semiconductor chip 60, a second gate pad 62 for a second MOSFET 23 formed at the margin center of an opposite long side, gate wires (gate runners) 61a and 61b of the first layer of metal (aluminum) wiring formed extending from the first gate pad 61 along the short side to the long side, a gate wire (gate runner) 62a of the first layer of metal (aluminum) wiring extending from the second gate pad 62 and arriving at the position just near the first gate pad 61, first gate electrodes 10 like stripes of polycrystalline silicon extending like comb teeth in the long side direction from the gate wires 61a and 61b, and second gate electrodes 21 like stripes of polycrystalline silicon extending like comb teeth in the long side direction from the gate wire 62a. The two first gate electrodes 10 and 10 and the two second gate electrodes 21 sandwiched therebetween make up stripe-like cells C1 to Cn. In the embodiment, as shown in FIG. 26, gate wires (gate runners) 65 of the first layer of metal (aluminum) wiring traversing the stripe-like gate electrodes 10 and 21 and coming in conductive contact with the gate electrodes 10 are formed like a lattice. Thus, the gate wires 65 are also added even to the cell Cn most distance from the gate pad 51 and reduce the wiring resistance. Resultantly, the gate signal propagation delay decreases, imbalance of a current distribution of the cells C1-Cn at the turn off time can be moderated, and current concentration in the most distant cell Cn is suppressed. Thus, turn off is speeded up as a matter of course and destruction in the most distant cell Cn becomes hard to occur, so that the controllable current capacity can be increased.

EMBODIMENT 21

Figure 27A:
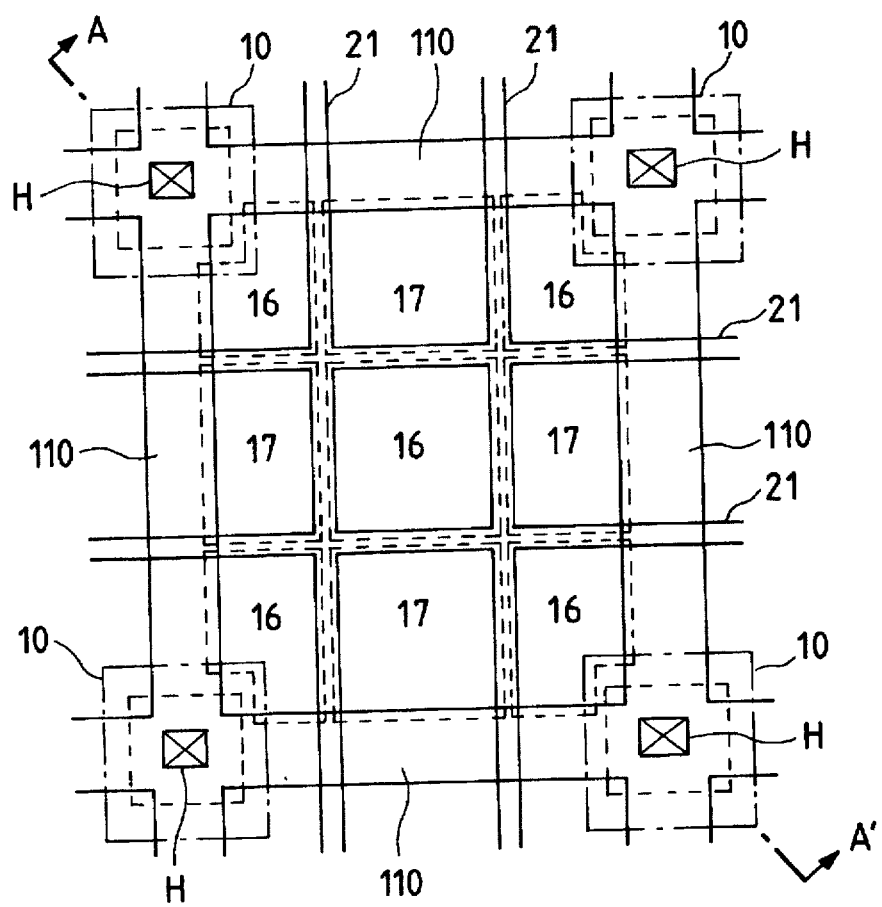
FIG. 27A is a plan view showing a chip layout of a thyristor semiconductor device with a double gate according to a twenty-first embodiment of the invention.
Figure 27B:
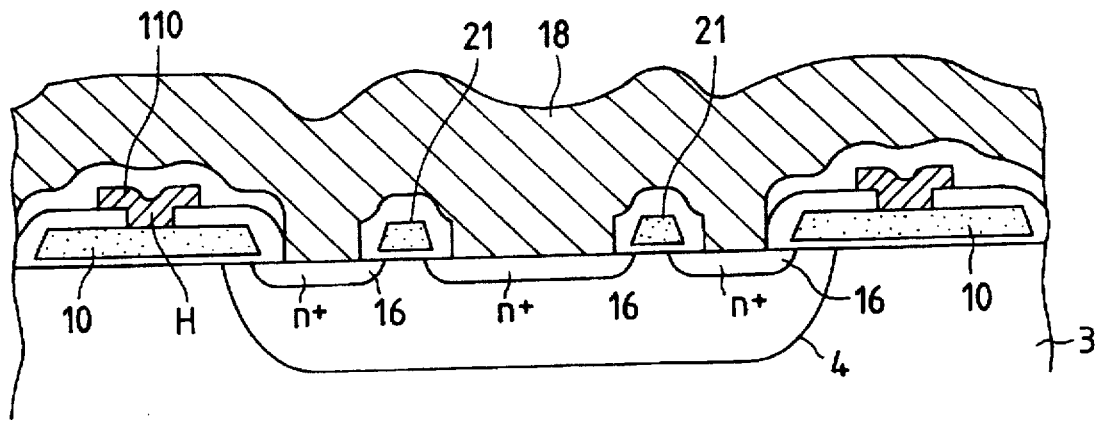
FIG. 27B is a perspective view showing the semiconductor device cut along a line A–A' in FIG. 27A.

FIG. 27A is a chip layout of a thyristor semiconductor device comprising a double gate according to a twenty-first embodiment of the invention. The chip layout in the embodiment has first gate electrodes 10 of rectangles of polycrystalline silicon formed in lattice points of the chip plane, lattice gate wires 110 of the first layer of metal (aluminum) wiring conducting via contact holes H to the first gate electrodes 10, and two vertical and horizontal second gate electrodes 21 of polycrystalline silicon running between the first gate electrodes 10 adjacent to each other. Therefore, one cell divided by the lattice gate wires 110 is divided into nine parts by the second gate electrodes 21. A fifth semiconductor region 16 is built in central and diagonal partitions of the nine parts and a fourth semiconductor region 15 and a sixth semiconductor region 17 are formed in the remaining partitions. A cathode electrode layer 18 conductively connected to the fifth semiconductor region 16 and the sixth semiconductor region 17 is formed by coating as the second layer of metal (aluminum) wiring.

Since the first gate electrode 10 is formed for each lattice point and the lattice points are connected like meshes by the lattice gate wires 110 in the embodiment, propagation delay is suppressed even in cells distant from a gate pad. Therefore, turn off is speeded up and the controllable current capacity can be increased.

Since the second gate electrodes 21 are formed like a vertical and horizontal lattice in the embodiment, signal delay is lessened even in cells distant from the gate pad, contributing to speeding up turn off.

Further, the fifth region 16 occupies the central and diagonal partitions in one cell and is formed dispersively and widely. Therefore, the current capacity can be increased at the thyristor operation time. Since the sixth regions 17 are formed in a check pattern with respect to the fifth regions 16, holes can be drawn out dispersively in the IGBT operation, contributing to an increase in the latch-up immunity amount.

EMBODIMENT 22

Figure 28A:
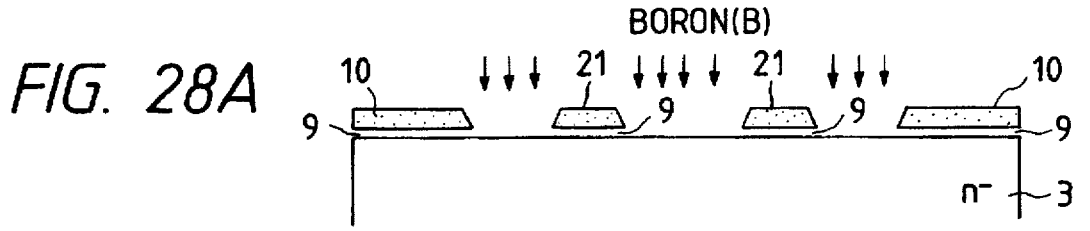
FIGS. 28A to 28D are sectional views showing processes for manufacturing the basic structure of the semiconductor device according to a twenty-second embodiment of the invention.
Figure 28B:
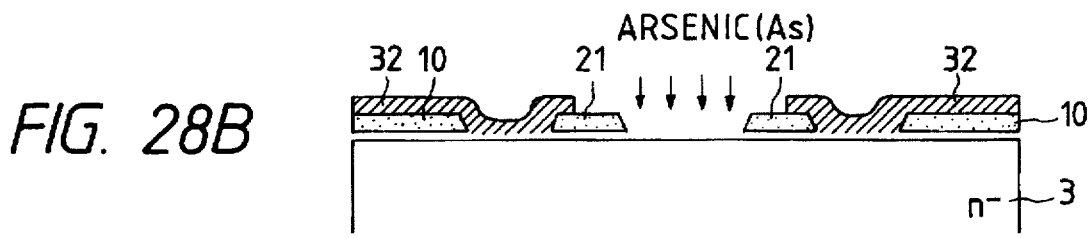
Figure 28C:
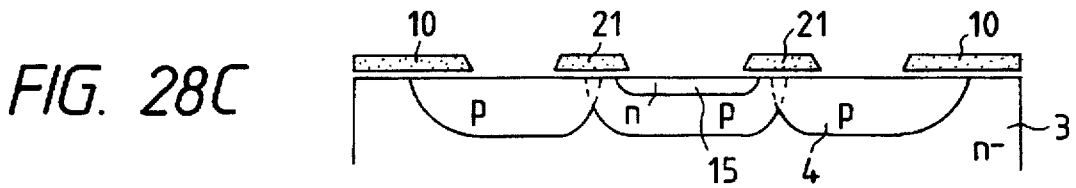
Figure 28D:
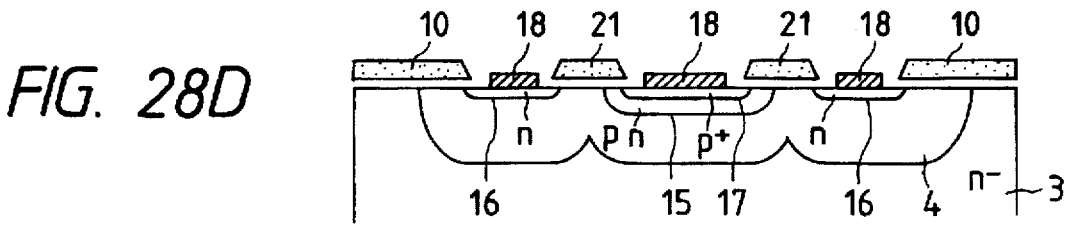
Figure 29:
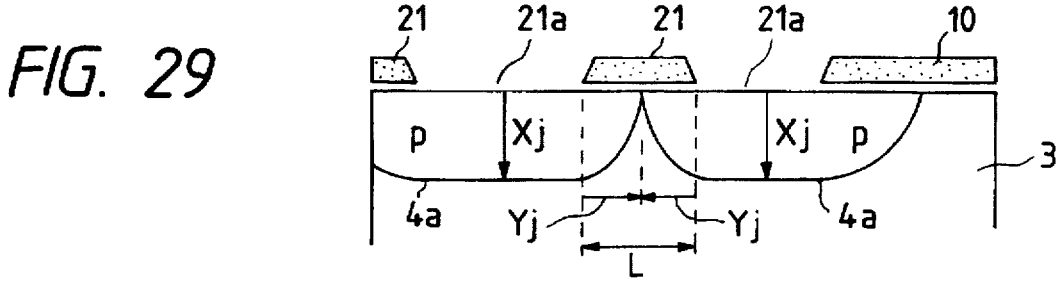
FIG. 29 is an explanatory diagram showing a method of forming a third semiconductor region in the twenty-second embodiment shown in FIGS. 28A to 28D.

FIGS. 28A to 28D are sectional views of steps showing a manufacturing method of the basic structure of the invention. As shown in FIG. 1, the second region 3 of n⁻ type is formed by epitaxial growth via the n⁺-type buffer layer 3a formed on the p⁺⁺-type semiconductor substrate, then as shown in FIG. 28A, the gate electrodes of polycrystalline silicon 10 and the gate electrodes 21 therebetween are formed at isolation positions via the gate oxide film 9 on the second region 3. After this, ion implantation of boron (B) is executed in a dose of $7\times10^{13}$ cm$^{-2}$ with the gate electrodes 10 and 21 as a mask. Next, as shown in FIG. 28B, the openings between the gate electrodes 10 at the outside and the gate electrodes 21 at the inside is coated with resist 32, then ion implantation of arsenic (As) is executed in a dose of $7\times10^{15}$ cm$^{-2}$ or antimony (Sb) with the gate electrodes 10 and 21 and the resist 32 as a mask. After the resist 32 is removed, as shown in FIG. 28C, the well of the third region 4 of p type and the well of the fourth region 15 of n type in the third region 4 are formed by thermally diffusing two kinds of impurities at the same time by drive in at 1150° C. for three hours. In the thermal diffusion step, p-type diffusion layers diffused from contiguous openings are interconnected by lateral diffusion, forming a single p-type well of the third region 4. If simultaneous thermal diffusion is not performed, boron (B) is thermally diffused by drive in at 1150° C. for three hours and arsenic (As), antimony (Sb) or phosphorus (p) is thermally diffused at 1100° C. for two hours. In the thermal diffusion process of the third semiconductor region 4 of p type, as shown in FIG. 29, p-type diffused layers 4a and 4a diffused from adjacent openings 21a and 21a with the gate electrode 21 between are interconnected just below the gate electrode 21 by horizontal diffusion and a single well of the third semiconductor region 4 of p type is formed as shown in FIG. 28C. Thus, after the gate electrodes are formed, the third region 4 of p type can be formed by self-alignment with the gate electrodes 10 and 21 as a mask, so that the number of steps can be reduced and the semiconductor area producing accuracy can be enhanced. Here, the conditions for allowing the two p-type diffused layers 4a diffused from the two openings 21a to be interconnected just below the gate electrode 21 will be considered. Generally, the following expression holds between diffusion length X in the vertical direction (depth direction) of thermal diffusion of acceptor impurities (boron) and diffusion length Y in the horizontal direction:

$$Y_j = (0.7 \text{ } 0.8) X_{hd} j \tag{1}$$

Therefore, the gate length L of the gate electrode 21 must satisfy the following expression:

$$L < 2X_j \approx 1.6X_j \tag{2}$$

For example, when $X_j=3$ μm, if the gate length L is made shorter than 4.8 μm, the two diffused layers 4a are interconnected just below the gate electrode 21 in the thermal diffusion step and the single well of the third semiconductor region 4 of p type can be formed. The third semiconductor region 4 can be formed by the interconnection, thereby ensuring formation of the gate electrode 10 and 21 even in one step and contributing to reduction in the number of steps.

Boron and arsenic or antimony are used as impurities so that acceptor impurities have a large diffusion coefficient as compared with donor impurities. Thus, the third region 4 of p type of a deep well and the fourth region 15 of a shallow well can be diffused and formed at the same time by one drive-in step, contributing to reduction in the number of steps. After this, again ion implantation of arsenic (As) is executed in a dose of $5\times10^{15}$ cm$^{-2}$ with the gate electrodes 10 and 21 as a mask and subsequently, ion implantation of BF$_2^+$ is executed in a dose of $2\times10^{15}$ cm$^{-2}$ with the gate electrodes 10 and 21 as a mask. As shown in FIG. 28D, by annealing at 1000° C. for 10 minutes, the sixth region 17 of p type like a shallow well is formed on the surface of the fourth region 15 of n type, and the fifth regions 16 of n type are formed. The reason why BF$_2^+$ is used is that the ion implantation is shallow so that the sixth region 17 of p⁺ type can be made about 0.5 μm deep. The fifth regions 16 of n type and the sixth region 17 of p⁺ type can be diffused and formed at the same time by one drive-in step, contributing to reduction in the number of steps. After this, holes are made in the interlayer insulating film (not shown) to form the cathode electrodes 18, on which a passivation film, (not shown) is formed. Thus, in the embodiment, the third region 4, the fourth region 15, the fifth regions 16 of n type, and the sixth region 17 can be formed by self-alignment with the gate electrodes 10 and 21 as a mask, and characteristic variations can be reduced.

Figure 30A:
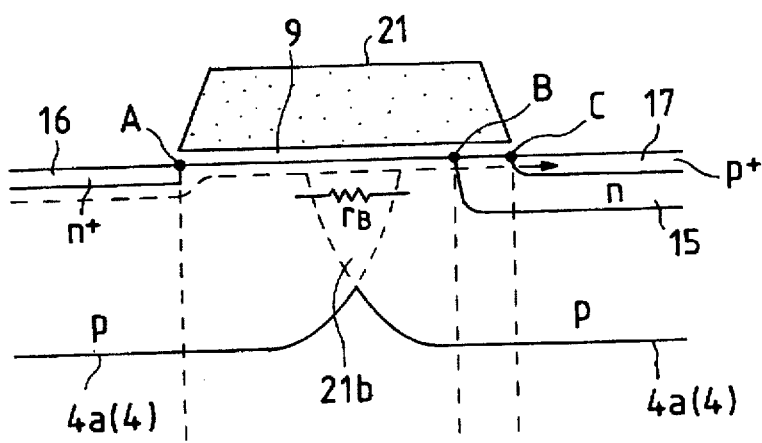
FIG. 30A is a sectional view showing the structure of the semiconductor device formed at a portion which is nearly directly below a second gate electrode by using the manufacturing method according to the twenty-second embodiment.
Figure 30B:
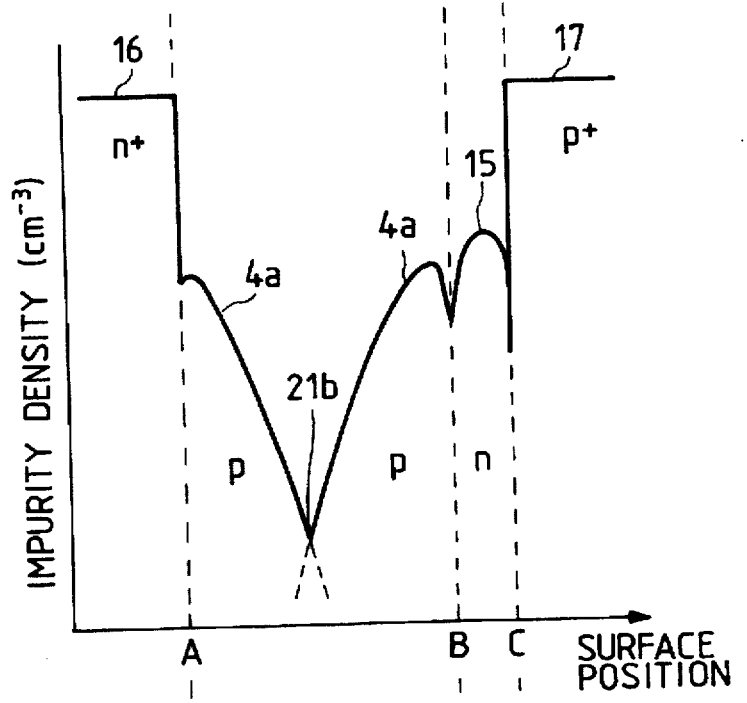
FIG. 30B is a graph representing a surface density distribution of the semiconductor device shown in FIG. 30A.
Figure 30C:
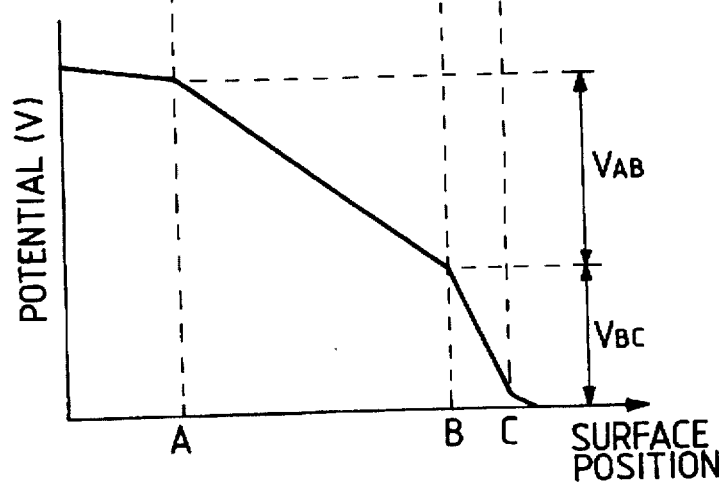
FIG. 30C is a graph representing a relationship between potentials and positions indicated by broken lines in FIG. 30A.

However, if the method of interconnecting the two diffused layers 4a just below the gate electrode 21 is adopted for forming the well of the third semiconductor region 4 as described above, it is feared that a problem may occur in the point of the latch-up immunity amount, as discussed below: In the semiconductor device using the third semiconductor region 4 of the single well formed by interconnecting the two diffused layers 4a on both sides just below the gate electrode 21 by thermal diffusion as shown in FIG. 30A, the relationship of the impurity densities with the semiconductor surface positions from the surface of the fifth semiconductor region 16 of $n^+$ type via the surface of the third semiconductor region 4 just below the gate electrode 21 to the surface of the fourth semiconductor region 15 of n type and the sixth semiconductor region 17 of $p^+$ type presents a distribution as shown in FIG. 30B. Since the two diffused layers 4a spread just below the gate electrode 21 by horizontal diffusion by side ends A and B of the gate electrode 21 and meet each other at a center 21b, the much dispersion executed, the thinner the impurity density; the center 21b just below the gate electrode 21 becomes particularly an impurity low-density region. Thus, when holes are drawn out in the IGBT operation, path potential (voltage drop amount) VAB from side end A to channel end B of the gate electrode 21 is an extremely large value as compared with channel path potential (voltage drop amount caused by on resistance) VBC as shown in FIG. 30C on the hole current path (indicated by the broken line in FIG. 30A) from just below the fifth semiconductor region 16 of $n^-$ type via just below the gate electrode 21 from the channel of the fourth semiconductor region 15 of n type to the sixth semiconductor region 17 of $p^+$ type. If the density is low and diffused resistor rB is parasitic just below the gate electrode 21, when holes are drawn out in the IGBT operation, the voltage just below the fifth semiconductor region 16 of $n^-$ type attempts to rise due to voltage drop of hole current. Thus, npn-type bipolar transistor Qnpn made up of the fifth semiconductor region 16 of $n^+$ type, the third semiconductor region 4 of p type, and the second semiconductor region 3 of $n^-$ type easily latches up and the controllable current capacity cannot be increased.

The longer the gate length L, the lower the impurity density just below the gate electrode 21. Therefore, the gate length L may be shortened. However, generally the gate electrode 21 is formed long like a stripe (for example, 5 mm) for lengthening the gate width for increasing the current capacity, and on the semiconductor chip, a large number of stripe gate electrodes (branch wiring) 21 like comb teeth extend from gate runners (main wiring) extending from the gate pad. Resultantly, a time difference occurs in propagation of a gate signal from a stripe gate electrode 21 near the gate pad to a stripe gate electrode 21 distant from the gate pad, causing a propagation delay (wiring resistance) problem. Therefore, to reduce the wiring resistance of the stripe gate electrodes 21 and suppress the signal delay for accelerating the operation switching speed, shortening the gate length of the gate electrode 21 of polycrystalline silicon is limited.

EMBODIMENT 23

Then, in a twenty-third embodiment of the invention, to shorten the gate length, gates of a single-layer structure made of metal or metal silicide having lower specific resistance than polycrystalline silicon or gates of a double structure of a polycrystalline silicon layer and a layer made of metal or metal silicide are adopted instead of using polycrystalline silicon gates for gate electrodes 21 of a second MOSFET 23. Even if the gate length L is shortened, such gate electrodes made of metal or metal silicide would be able to avoid the disadvantages of remarkable propagation delay and raise the impurity density just below the gate electrode 21, increasing the controllable current capacity. The gates of a single-layer structure made of metal or metal silicide or gates of a double structure of a polycrystalline silicon layer and a layer made of metal or metal silicide may be adopted for gate electrodes 10 of a first MOSFET 23 as well as the gate electrodes 21 of the second MOSFET 23; this leads to improvement in the operation switching speed, furthermore shorting the turn off time.

EMBODIMENT 24

FIGS. 31A to 31D are sectional views of steps showing another manufacturing method of the basic structure of the invention. In the manufacturing method of the embodiment, gate electrodes 21 and 10 are not formed simultaneously and after boron (acceptor impurities for a fourth semiconductor region 15) is ion-implanted, the gate electrodes 21 are formed.

Figure 31A:
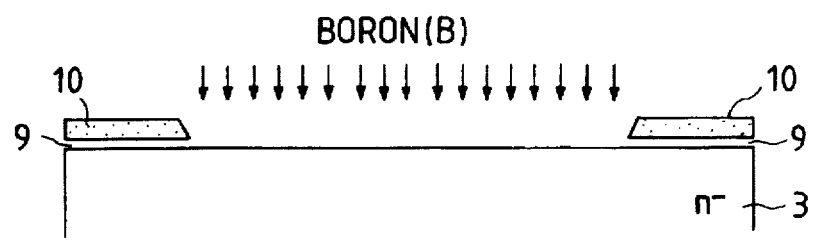
FIGS. 31A to 31D are sectional views showing steps showing another manufacturing method of the basic structure according to a twenty-fourth embodiment of the invention.

As shown in FIG. 1, a second semiconductor region 3 of $n^-$ type is formed by epitaxial growth via an $n^+$-type buffer layer 3a formed on a $p^{++}$-type semiconductor substrate, then as shown in FIG. 31A, two first MOSFET gate electrodes 10 of polycrystalline silicon are formed at isolation positions via a gate oxide film 9 on the second semiconductor region 3. After this, ion implantation of boron (B) is executed into an opening in a dose of $7 \times 10^{13}$ cm$^{-2}$ with the gate electrodes 10 and 10 as a mask.

Figure 31B:
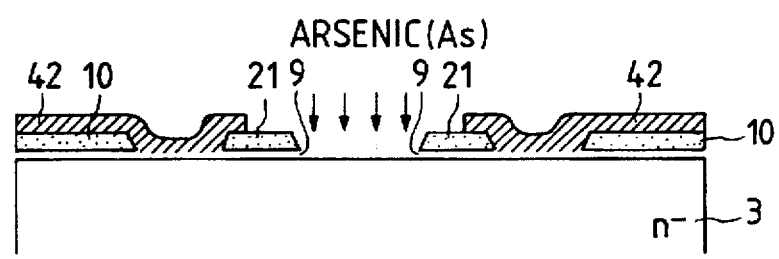

Next, as shown in FIG. 31B, after two second MOSFET gate electrodes 21 of polycrystalline silicon are formed at isolation positions via the gate oxide film 9 between the two gate electrodes 10, an opening between the outer gate electrode 10 and the inner gate electrode 21 is coated with resist 32, then ion implantation of arsenic (As) or antimony (Sb) is executed through the opening between the two gate electrodes 21 in a dose of $7 \times 10^{15}$ cm$^{-2}$ with the gate electrodes 10 and 21 and the resist 32 as a mask.

Figure 31C:
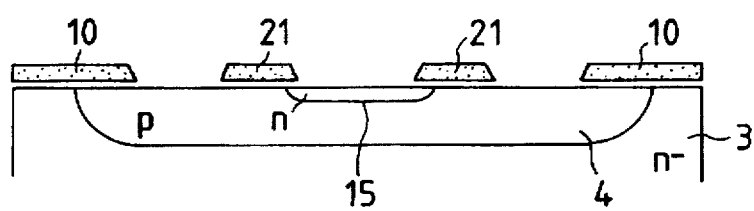

In the subsequent steps, as in the embodiment shown in FIG. 28, after the resist 32 is removed, as shown in FIG. 31C, a deep well of the third semiconductor region 4 of p type and a shallow well of the fourth semiconductor region 15 of n type in the third semiconductor region 4 are formed by simultaneous thermal diffusion of the two types of impurities by drive in at 1150 for three hours. (If simultaneous thermal diffusion is not performed, boron (B) is thermally diffused by drive in at 1150 for three hours and arsenic (As), antimony (Sb) or phosphorus (p) is thermally diffused at 1100 for two hours.) After this, ion implantation of arsenic (As) is again executed in a dose of $5 \times 10^{13}$ cm$^{-2}$ with the gate electrodes 10 and 21 as a mask and subsequently, ion implantation of BF$_2$ is executed in a dose of $2 \times 10^{15}$ cm$^{-2}$ with the gate electrodes 10 and 21 as a mask.

Figure 31D:
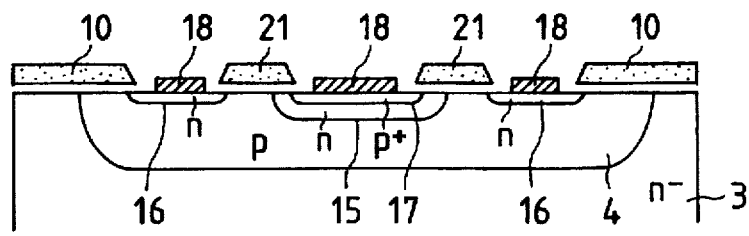

As shown in FIG. 31D, a shallow sixth semiconductor region 17 of p type is formed on the surface of the fourth semiconductor region 15 of n type and the fifth semiconductor region 16 of $n^-$ type is formed by annealing at 1000 for 10 minutes. The fifth semiconductor region 16 of n type and the sixth semiconductor region 17 of $p^-$ type can be diffused and formed simultaneously by one drive-in step, contributing to reduction in the number of steps. After this, holes are made in the interlayer insulating film (not shown) to form the cathode electrodes 18, on which a passivation film (not shown) is formed. Of course, ion implantation and diffusion of the fifth semiconductor region 16 and those of the sixth semiconductor region 17 may be executed separately.

Thus, in the manufacturing method of the embodiment, to prevent the impurity density in the region just below the gate electrode 21 in the third semiconductor region 4 from being made thinner than other portions, the third semiconductor region 4 is formed, then the gate electrode 21 is placed thereon. Thus, the latch-up immunity amount can be increased without shortening the gate length of the gate electrode 21 of polycrystalline silicon. Of course, gates of a single-layer structure made of metal or metal silicide or gates of a double structure of a polycrystalline silicon layer and a layer made of metal or metal silicide rather than single layers of polycrystalline silicon may be adopted for the gate electrodes 10 and 21 in the embodiment. The propagation delay amount can be lessened by shortening the gate length, thus contributing to improvement in the operation switching speed and an increase in the controllable current capacity.

EMBODIMENT 25

FIGS. 32A to 32E are sectional views of steps showing another manufacturing method of the basic structure of the invention. In the manufacturing method of the embodiment, gate electrodes 21 and 10 are not formed simultaneously and after a third semiconductor region 4 is diffused and formed, the gate electrodes 21 are formed.

Figure 32A:
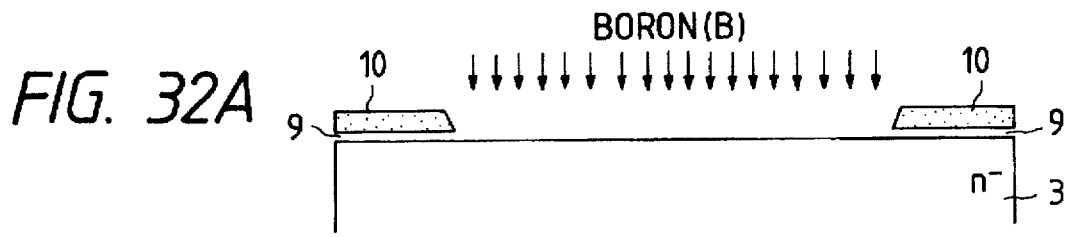
FIGS. 32A to 32E are sectional views showing steps showing still another manufacturing method of the basic structure according to a twenty-fifth embodiment of the invention.
Figure 32B:
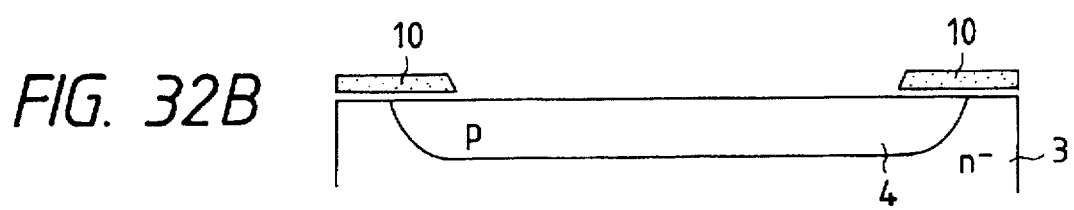

As shown in FIG. 1, a second semiconductor region 3 of n⁻ type is formed by epitaxial growth via an n⁺-type buffer layer 3a formed on a p⁺⁺-type semiconductor substrate, then as shown in FIG. 32A, two first MOSFET gate electrodes 10 of polycrystalline silicon are formed at isolation positions via a gate oxide film 9 on the second semiconductor region 3. After this, ion implantation of boron (B) is executed into an opening in a dose of $7 \times 10^{13}$ cm$^{-2}$ with the gate electrodes 10 and 10 as a mask. As shown in FIG. 32B, a well of a third semiconductor region 4 of p type is diffused and formed by drive in.

Figure 32C:
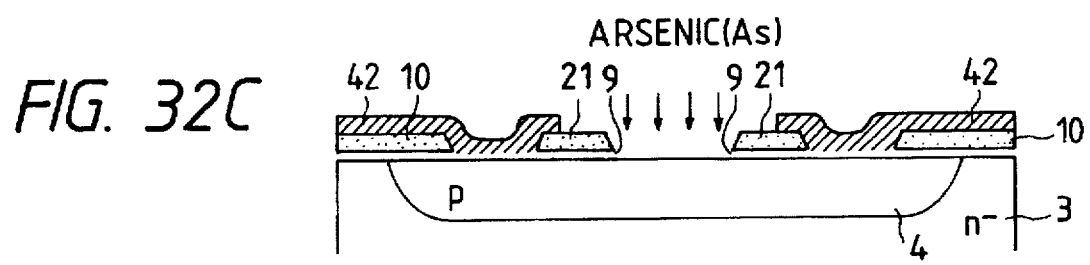
Figure 32D:
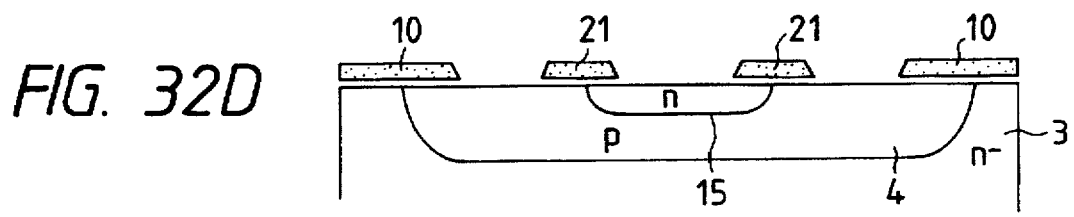

Then, as shown in FIG. 32C, after two second MOSFET gate electrodes 21 of polycrystalline silicon are formed at isolation positions via the gate oxide film 9 between the two gate electrodes 10, an opening between the outer gate electrode 10 and the inner gate electrode 21 is coated with resist 42, then ion implantation of arsenic (As), antimony (Sb), or phosphorus (p) is executed through the opening between the two gate electrodes 21 in a dose of $7 \times 10^{13}$ cm$^{-2}$ with the gate electrodes 10 and 21 and the resist 42 as a mask. As shown in FIG. 32D, a fourth semiconductor region 15 is diffused and formed by drive in.

Figure 32E:
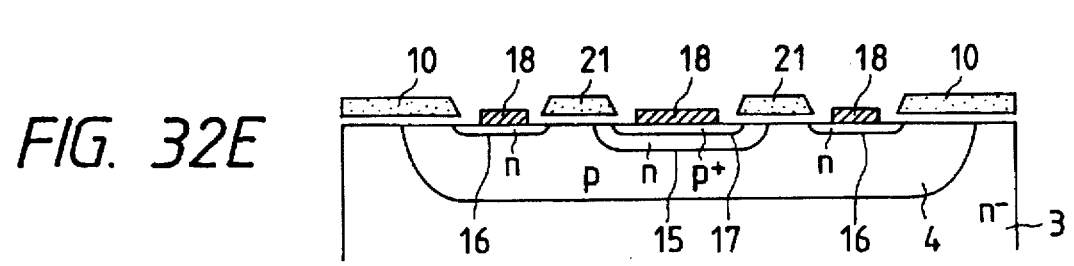

After this, ion implantation of arsenic (As) is again executed in a dose of $5 \times 10^{15}$ cm$^{-2}$ with the gate electrodes 10 and 21 as a mask and subsequently, ion implantation of BF$_2$ is executed in a dose of $2 \times 10^{15}$ cm$^{-2}$ with the gate electrodes 10, 10, 21, and 21 as a mask. As shown in FIG. 32E, a fifth semiconductor region 16 of n type and a sixth semiconductor region 17 of p⁺ type are diffused and formed simultaneously by drive in. Of course, ion implantation and diffusion of the fifth semiconductor region 16 and those of the sixth semiconductor region 17 may be executed separately.

Also in the manufacturing method of the embodiment, the impurity density in the region just below the gate electrode 21 in the third semiconductor region 4 is equal to that in other portions, thus the latch-up immunity amount can be increased without shortening the gate length of the gate electrode 21 of polycrystalline silicon. Of course, also in the embodiment, gates of a single-layer structure made of metal or metal silicide or gates of a double structure of a polycrystalline silicon layer and a layer made of metal or metal silicide without using single layers of polycrystalline silicon may be adopted for the gate electrodes 10 and 21.

EMBODIMENT 26

Figure 33:
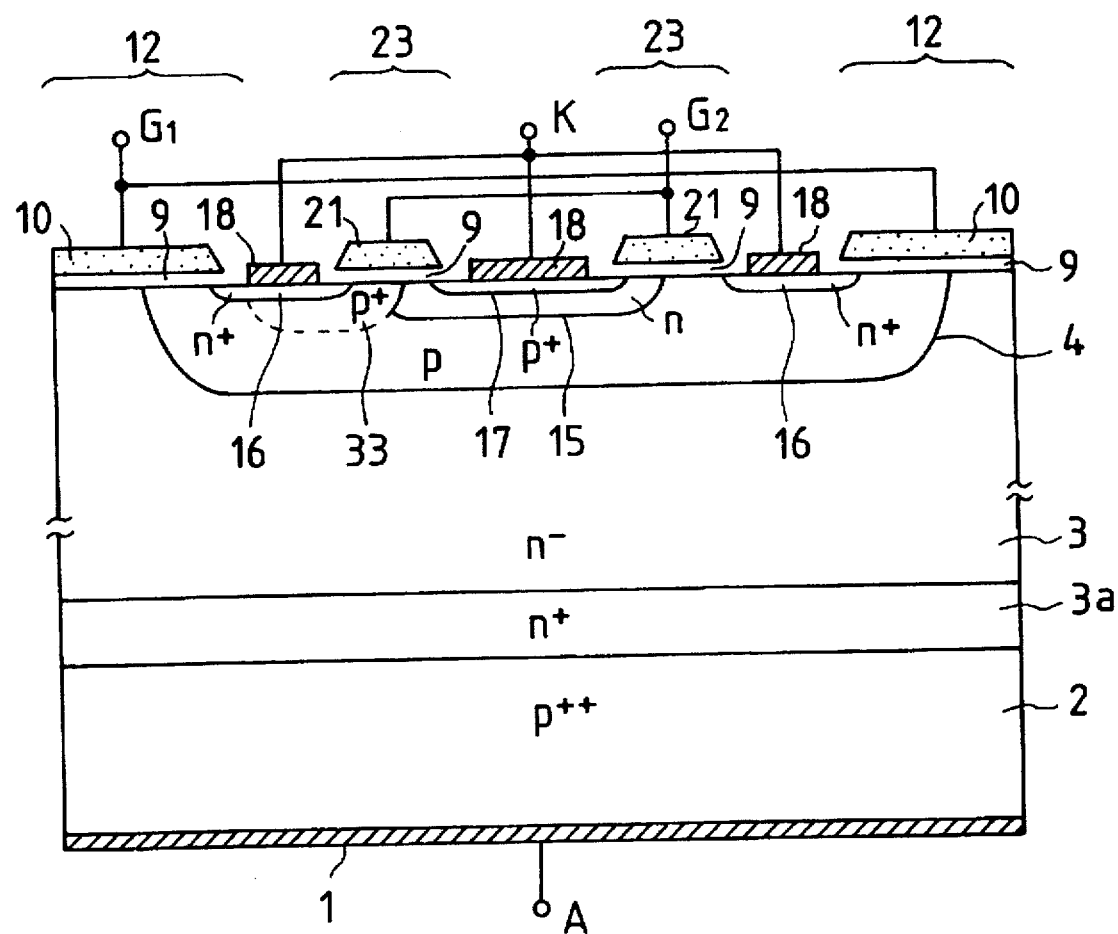
FIG. 33 is a sectional view showing the structure of a thyristor semiconductor device with a double gate according to a twenty-sixth embodiment of the invention.

FIG. 33 is a sectional view showing the structure of a thyristor semiconductor device comprising a double gate according to a twenty-sixth embodiment of the invention. In the semiconductor structure of the embodiment, as compared with the basic structure of the first embodiment, a well of a ninth semiconductor region 33 of p⁺ type is built in as a drift region from the region just below a fifth semiconductor region 16 to the region just below a gate electrode 21. Since just below the gate electrode 21 is the ninth semiconductor region 33 of p⁺ type except a channel (surface layer of a fourth semiconductor region 15), the value of diffused resistor rB just below the gate electrode 21 can be furthermore lessened. Therefore, the latch-up immunity amount can be increased.

Figure 34A:
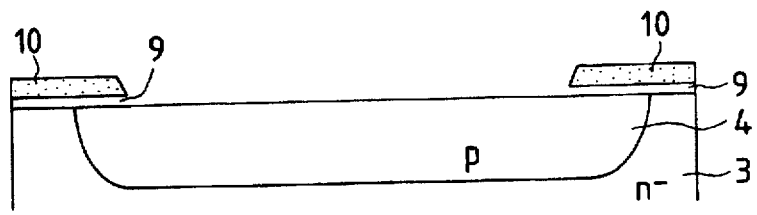
FIGS. 34A to 34E are sectional views showing a method of manufacturing the semiconductor device in the twenty-sixth embodiment shown in FIG. 33.

A manufacturing method of the semiconductor structure shown in FIG. 33 will be discussed. First, as shown in FIG. 33, a second semiconductor region 3 of n⁻ type is formed by epitaxial growth via an n⁺-type buffer layer 3a formed on a p⁺⁺-type semiconductor substrate, then as shown in FIG. 34A, first MOSFET gate electrodes 10 and 10 of polycrystalline silicon are formed at isolation positions via a gate oxide film 9 on the second semiconductor region 3. After this, ion implantation of boron (B) is executed into an opening in a dose of $7 \times 10^{15}$ cm$^{-2}$ with the gate electrodes 10 and 10 as a mask. A well of a third semiconductor region 4 of p type is diffused and formed by drive in.

Figure 34B:
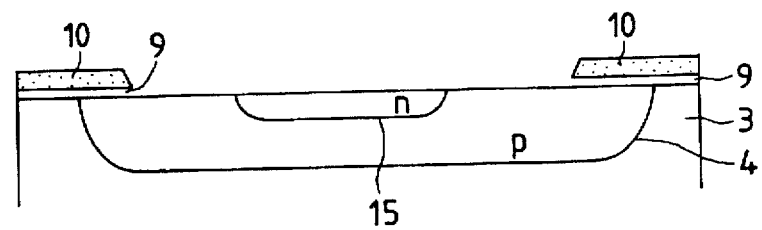

After this, as shown in FIG. 34B, ion implantation of arsenic (As), antimony (Sb) or phosphorus (p) is executed through the opening between the two gate electrodes 10 in a dose of $7 \times 10^{13}$ cm$^{-2}$ with a resist mask, and a fourth semiconductor region 15 of n type of a shallow well is diffused and formed by drive in.

Figure 34C:
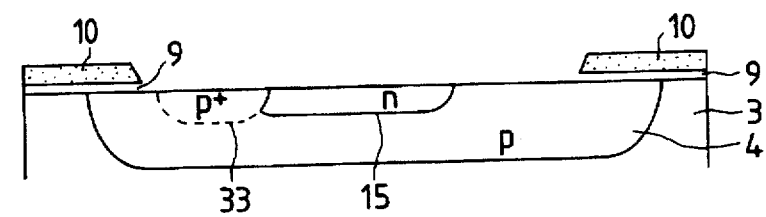
Figure 34D:
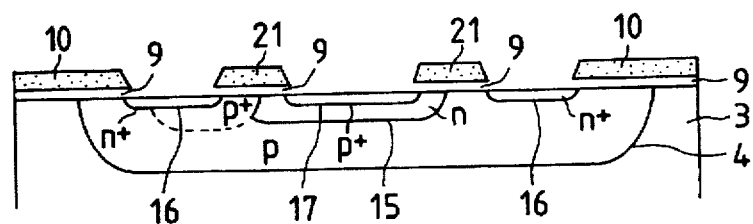
Figure 34E:
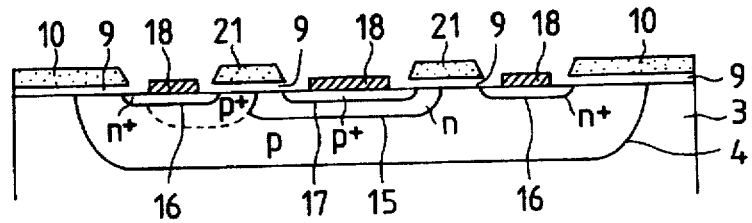
Figure 35:
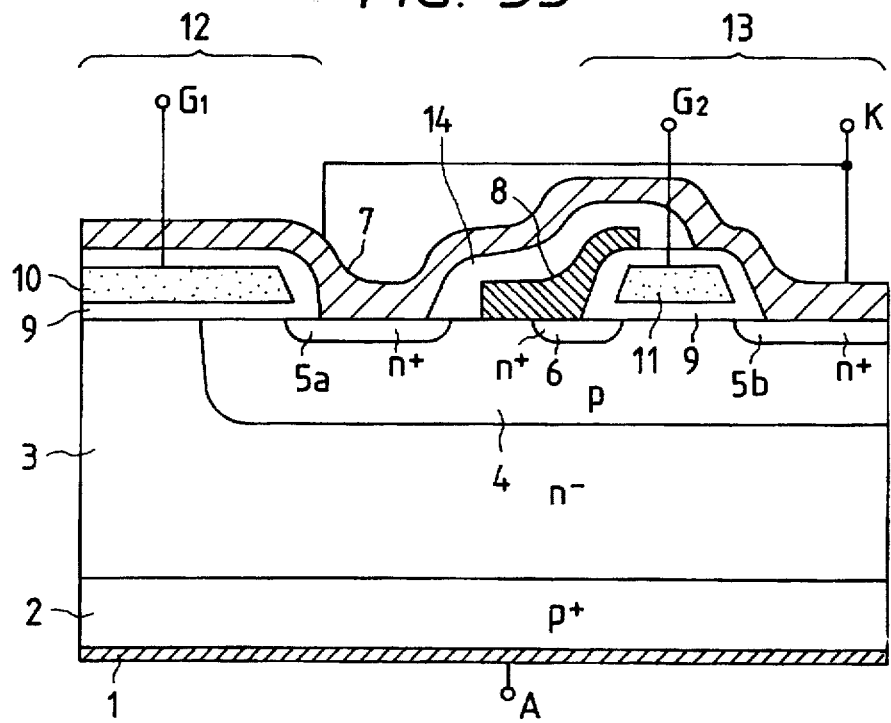
FIG. 35 is a sectional view showing an example of the structure of a conventional double gate type semiconductor device.
Figure 36:
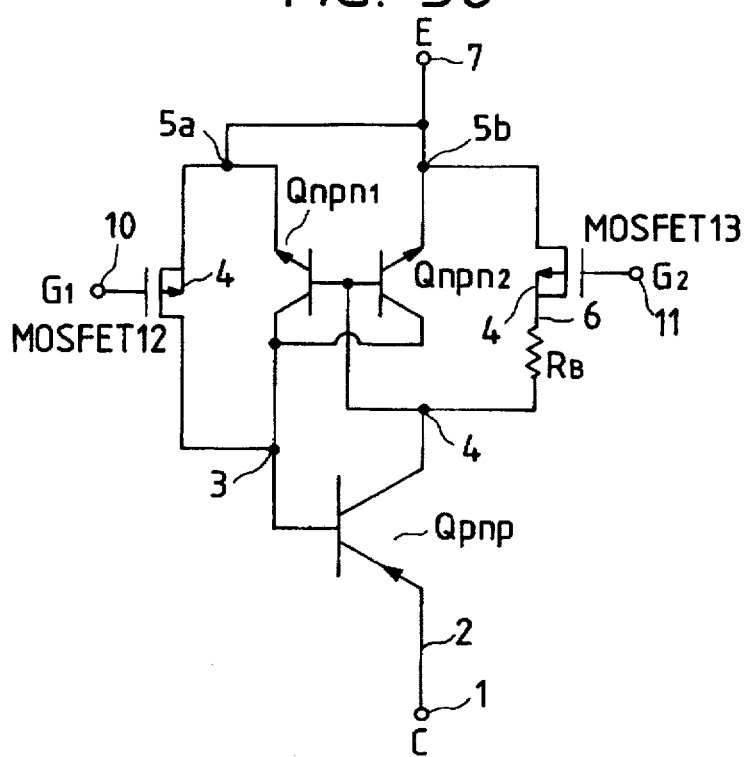
FIG. 36 is a circuit diagram showing an equivalent circuit of the semiconductor device shown in FIG. 35.
Figure 37A:
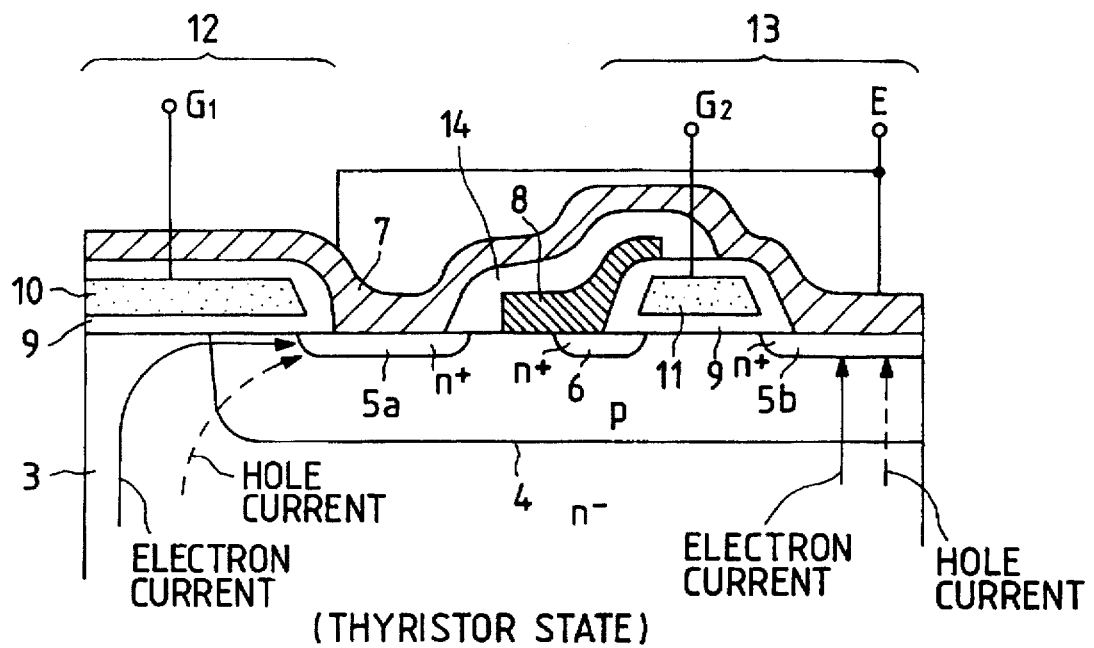
FIG. 37A is a sectional view showing flows of electron current and hole current in a thyristor state of the semiconductor device shown in FIG. 35.
Figure 37B:
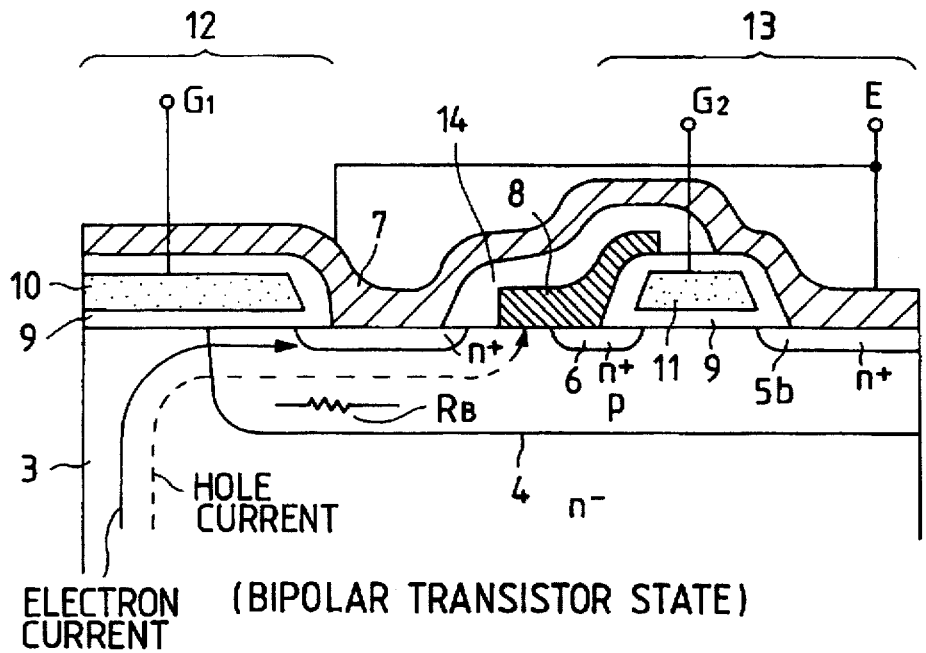
FIG. 37B is a sectional view showing flows of electron current and hole current in a transistor state (IGBT state) of the semiconductor device.

Ion implantation of B⁺ or BF⁺$_2$ is executed overlapping the gate electrode 12 side of the fourth semiconductor region 15 with a resist mask, and as shown in FIG. 34C, a well of a ninth semiconductor region 33 of p⁺ type is diffused and formed by drive in.

Next, as shown in FIG. 4D, two second MOSFET gate electrodes 21 of polycrystalline silicon are formed via the gate oxide film 9 so as to cover the surface boundary portion between the fourth semiconductor region 15 and the ninth semiconductor region 33. Then, ion implantation of BF$_2$ is executed through the opening between the gate electrodes 21 and 21 with the gate electrodes 10 and 21 and resist as a mask and ion implantation of arsenic (As) or antimony (Sb) is executed through the opening between the gate electrodes 21 and 10. A sixth semiconductor region 17 of p⁺ type and a fifth semiconductor region 16 of n⁻ type are formed by self-alignment by annealing. After this, holes are made in an interlayer insulating film (not shown) to form a cathode electrode 18, on which a passivation film (not shown) is formed.

As described above, the semiconductor device according to the invention adopts a double diffusion type structure for the MISFET for drawing out majority carriers to make the MISFET for injecting majority carriers and the MISFET for drawing out majority carriers inverse conductivity types to each other. Therefore, the semiconductor device produces the following effects:

(1) The majority carriers in the third semiconductor region can be directly drawn out via the MISFET of first conductivity type, eliminating the need for forming the short-circuit electrode (metal electrode) for converting carriers as electrode wiring on the first layer as in the conventional structure. Thus, difficulty in forming fine electrodes and the 2-layer structure of electrode wiring can be avoided. Since the MISFET of first conductivity type is a double diffusion type structure MISFET, the channel can be shortened by self-alignment and the MISFET itself can be put into low on-state resistance, thus reducing the switching loss, hastening the majority carrier drawing out speed and increasing the turn off speed. Further, characteristic variations of the MISFET can also be suppressed.

(2) The structure having a high-density region on the well end side of the third semiconductor region enables lowering the parasitic resistance value of the drawing out current path of majority carriers in the IGBT state, so that the latch-up immunity amount can be enlarged.

(3) In the structure wherein the fifth semiconductor region is an overlap region of the inner well region having a high impurity density and the outer well region having a low density, the inner well region functions as a substantial cathode region in the thyristor state and at the IGBT operation time, the voltage in the surroundings of the outer well region becomes lower due to the voltage drop of a diffused resistor, but the current amplification factor in the portion is low, thus latch-up is hard to occur at the IGBT operation time. Therefore, the controllable current capacity can be increased.

(4) In the structure wherein the first conduction type seventh semiconductor region is formed directly below the fifth region, the parasitic resistance value below the fifth semiconductor region can be reduced, thus the latch-up in the transistor state can be suppressed and the controllable current value can be increased.

(5) In the structure wherein the ninth semiconductor region of first conduction type having a high impurity density is formed in the third semiconductor region just below the gate electrode of first conduction type MISFET, the diffused resistance value just below the gate electrode can be lessened, thus the latch-up immunity amount can be increased.

(6) If one of the MISFET of first conductivity type and the MISFET of second conductivity type is of enhancement type and the other is of depletion type, on/off control of the MISFETs can also be performed with either positive or negative power supply of gate voltage, so that the gate drive circuit can be simplified.

(7) If the structure containing trench gate type MISFET in at least one of second conduction type MISFET and first conduction type MISFET is adopted, vertical channels increase, thus the channel width increases as a whole, increasing the current capacity and also contributing to making the gate length fine.

(8) If the first conduction type MISFET is a trench gate type MISFET having a trench gate electrode embedded via a gate insulating film in a trench separating the sixth and fourth semiconductor regions and the second conduction type MISFET is a trench gate type MISFET having a trench gate electrode embedded via a gate insulating film in a trench of the well end of the third semiconductor region, the hole drawing out force in the IGBT state can strengthen, speeding up the turn off time. Since the hole drawing out current scatters, the voltage drop caused by parasitic resistance can also be suppressed and the latch-up immunity amount can be enlarged. Further, since electron current flows in the vertical direction from the beginning along the side wall of the gate electrode of second conduction type MISFET, thus the gate electrode can be made fine. Since on resistance lowers, the switching loss can be decreased.

(9) If the fourth and fifth semiconductor regions are connected in overlapped relation in the above-mentioned trench gate type MISFET structure, not only the fifth semiconductor region, but also the fourth semiconductor region functions as a wide electron collection region in the thyristor state, so that the current capacity can be increased.

(10) If the first conduction type MISFET is a pair of trench gate type MISFETs having a trench gate electrode embedded via a gate insulating film in a trench of the well end where the sixth and fourth semiconductor regions face each other and the second conduction type MISFET is a trench gate type MISFET having a trench gate electrode embedded via a gate insulating film in a trench of the well end of the third semiconductor region, the distance between the gate electrodes of the second conduction type MISFET can be shortened. Thus, the plane occupation percentage of the fifth semiconductor region can be enlarged and the current capacity can be increased. In such a case, if the fourth semiconductor region is formed as a first conduction type region having a low impurity density, the second conduction type MISFET is of depletion type, thus the gate drive circuit can be simplified.

(11) In the structure wherein the short-circuit electrode conducting with the electrode coming in conductive contact with the fifth and sixth semiconductor region is brought into conductive contact with the third semiconductor region, in the transistor state the majority carriers in the third semiconductor region can be directly drawn out not via the MISFET of first conductivity type and the controllable current value can be increased. In particular, in the structure wherein the third semiconductor region is a stripe-like well and the short-circuit electrode is formed on the end surface in the length of the well, the latch-up in the corners can be suppressed and in the thyristor operation mode, the majority carrier density in the third region can also be enriched. If anode-cathode voltage is applied with the MISFETs of first and second conductivity types remaining off, current leaks into the cathode via the short-circuit electrode, preventing latch-up to occur when power is turned on.

(12) In the structure wherein a plurality of first conduction type MISFET parts for drawing out majority carriers are formed in the region sandwiched between a pair of the fifth semiconductor regions formed on the well end facing the third semiconductor region, the majority carrier drawing out force in the IGBT state can be strengthened and the controllable current can be increased.

(13) In the structure wherein the eighth semiconductor region of the first conduction type like a well is formed on the surface side of the third semiconductor region among the first conduction type MISFET parts for drawing out majority carriers, the electron collection capability by the eighth semiconductor region increases, thus increasing the current capacity in the thyristor state.

(14) If the structure comprising a double diffusion structure of the sixth semiconductor region and the fourth semiconductor region formed on the well end facing the third semiconductor region and the eighth semiconductor region of the first conduction type formed like a well on the surface side of the third semiconductor region in the region put in the double diffusion structure is adopted, the majority carrier drawing out current path can be shortened, thus the controllable current capacity can be increased.

(15) In the structure wherein the fifth and eighth semiconductor regions are connected via a connection diffusion layer of the first conduction type and the electrode is brought into conductive contact with the eighth semiconductor region, a diffused resistor is parasitic on the current path from the fifth semiconductor region via the connection diffusion layer and the eighth semiconductor region to the electrode; the forward voltage of the fifth semiconductor region on the well end side and the third semiconductor region just below it does not become relatively higher due to the voltage drop of the diffused resistor. Latch-up can be suppressed and the controllable current capacity can be increased.

(16) In the structure wherein second conduction type MISFET for path switching for shutting off conduction of the fifth and eighth semiconductor regions is formed and the electrode is brought into conductive contact with the eighth semiconductor region, if the second conduction type MISFET for path switching is turned on at the turn off time, the current flowing through the fifth semiconductor region is lost, thus latch-up can be eliminated. Particularly, if a part of the gate electrode of the second conduction type MOSFET is used as the gate electrode of the second conduction type MISFET for path switching, reduction in the number of manufacturing steps and a fine pattern are enabled.

(17) If the structure is adopted wherein the gate electrodes of the second conduction type MISFETs are placed side by side like stripes on the chip layout and gate wires leading to the gate pad conduct to the gate electrodes like a lattice, the gate signal propagation delay is decreased and current concentration in the most distant gate electrode at the turn off time can be suppressed. Thus, turn off is speeded up as a matter of course and destruction at the most distant gate electrode becomes hard to occur and the controllable current capacity can be increased.

(18) If the structure is adopted wherein the gate electrodes of the second conduction type MISFETs are like islands disposed at lattice points on the chip layout, gate wires leading to the gate pad conduct to the gate electrodes like a lattice, and the intralattice region partitioned by the gate wires is divided by the lattice-like gate electrodes of the first conduction type MISFETs, the propagation delay is suppressed even in gate electrodes of second conduction type MISFETs distant from the gate pad, so that turn off can be speeded up and the controllable current capacity can be increased. The gate electrodes of the first conduction type MISFETs are formed like a vertical and horizontal lattice, thus also contributing to speeding up turn off. Since one intralattice region is divided by the gate electrodes, the current capacity can be increased at the thyristor operation time. In addition, majority carriers can be drawn out dispersively in the IGBT operation, contributing to an increase in the latch-up immunity amount.

(19) In the first manufacturing method of the invention, adjacent diffused regions of first conduction type impurities are made contiguous below the gate electrodes of the first conduction type MISFETs by drive in in the first thermal diffusion step, the number of steps can be reduced and the semiconductor region building-in accuracy can be enhanced.

(20) If any structure selected from the group consisting of a single-layer structure of meal, a single-layer structure of metal silicide, a two-layer structure of polycrystalline silicon and metal, and a two-layer structure of polycrystalline silicon and metal silicide is adopted for the second gate electrodes, the gate electrodes can be made fine and the propagation delay amount can be lessened, thus contributing to improvement in the operation mode switching speed and an increase in the controllable current capacity.

(21) In the second and third manufacturing methods of the invention, the impurity density in the region just below the second gate electrode in the third semiconductor region can be prevented from being made thinner than other portions, so that the latch-up immunity amount can be increased without shortening the gate length.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor device comprising:
   a first semiconductor region of said first conductivity type;
   a second semiconductor region of said second conductivity type formed on said first semiconductor region;
   a third semiconductor region of said first conductivity type formed like a well in said second semiconductor region;
   a fourth semiconductor region of a second conductivity type formed like a well on a surface in said third semiconductor region;
   a fifth semiconductor region of second conductivity type formed like a well on a well end on the surface in said third semiconductor region;
   a sixth semiconductor region of first conductivity type formed like a well on a surface in said fourth semiconductor region;
   a cathode electrode electrically coupled to the fifth semiconductor region and the sixth semiconductor region;
   a MISFET of second conductivity type, having a double diffusion type structure including the third semiconductor region and the fifth semiconductor region, which allows majority carriers thereof to be implanted into said second semiconductor region from said fifth semiconductor region; and
   a MISFET of first conductivity type having a double diffusion type structure which is enabled and disabled independently of said MISFET of second conductivity type and allows majority carriers thereof to be drawn out into said sixth semiconductor region from said third semiconductor region.

2. A semiconductor device as claimed in claim 1, wherein a region on the well end of said third semiconductor region is a high-density region having a density higher than an impurity density of an inside region of said third semiconductor region.

3. A semiconductor device as claimed in claim 1, wherein said fifth semiconductor region comprises an inside well region having a high impurity density which is formed on said MISFET of first conductivity type in said third semiconductor region, and a region which is formed on the well end of said third semiconductor region and overlaps with an outside well region having a impurity density lower than the impurity density of said inside well region.

4. A semiconductor device as claimed in claim 1, further comprising a seventh semiconductor region of first conductivity type having an impurity density higher than the impurity region of said third semiconductor region, which is formed in said third semiconductor region just below said fifth semiconductor region.

5. A semiconductor device as claimed in claim 4, wherein said seventh semiconductor region is a shallow well region to such a degree that a part of said third semiconductor region is left just below said fifth semiconductor region.

6. A semiconductor device as claimed in claim 4, wherein said seventh semiconductor region is a deep well region to such a degree that it pierces said third semiconductor region left just below said fifth semiconductor region and abuts on said second semiconductor region.

7. A semiconductor device as claimed in claim 1, further comprising a ninth semiconductor region of first conductivity type having a high impurity density, which is formed in said third semiconductor region just below a gate electrode of said MISFET of first conductivity type.

8. A semiconductor device as claimed in claim 1, wherein one of said MISFET of first conductivity type and said MISFET of second conductivity type is of enhancement type and the other is of a depletion type.

9. A semiconductor device as claimed in claim 1, wherein at least one of said MISFET of second conductivity type and said MISFET of first conductivity type includes a trench gate MISFET.

10. A semiconductor device as claimed in claim 9, wherein said MISFET of first conductivity type comprises a trench gate MISFET having a trench gate electrode which is embedded through a gate insulating film in a trench groove that divides said sixth semiconductor region and said fourth semiconductor region, and said MISFET of second conductivity type comprises a trench gate MISFET having a trench gate electrode which is embedded through a gate insulating film in a trench groove on the well end of said third semiconductor region.

11. A semiconductor device as claimed in claim 10, wherein said fourth semiconductor region and said fifth semiconductor region overlap with each other so as to be connected to each other.

12. A semiconductor device as claimed in claim 9, wherein said MISFET of first conductivity type comprises a pair of trench gate MISFETs each having a trench gate electrode which is embedded through a gate insulating film in a trench groove of the well end at which said sixth semiconductor region and said fourth semiconductor region face with each other, and said MISFET of second conductivity type comprises a trench gate MISFET having a trench gate electrode which is embedded through a gate insulting film in a trench groove on the well end of said third semiconductor region.

13. A semiconductor device as claimed in claim 12, wherein said fourth semiconductor region comprises a first conductivity region having a low impurity density.

14. A semiconductor device as claimed in claim 1, further comprising an electrode coming in conductive contact with said fifth semiconductor regions, and a short-circuit electrode coupled to said electrode and being brought into conductive contact with said third semiconductor region.

15. A semiconductor device as claimed in claim 14, wherein said third semiconductor region is a stripe-like well and said sort-circuit electrode is formed on an end surface in the length of the well.

16. A semiconductor device as claimed in claim 1, wherein a plurality of said MISFETs of first conductivity type are formed in a region sandwiched between a pair of said fifth semiconductor regions formed on a well end which faces with said third semiconductor region.

17. A semiconductor device as claimed in claim 16, further comprising an eighth semiconductor region of first conductivity type formed like a well on the surface of said third semiconductor region between said plurality of MISFETs of first conductivity type.

18. A semiconductor device as claimed in claim 1, further comprising a double diffusion type structure of said fourth and sixth semiconductor regions formed on the well end which faces with said third semiconductor region, and an eighth semiconductor region of first conductivity type formed like a well on the surface of said third semiconductor region in a region sandwiched by said double diffusion type structure.

19. A semiconductor device as claimed in claim 17 or 18, wherein said fifth and eighth semiconductor regions are connected to each other through a coupling diffusion layer of first conductivity type; and further comprising an electrode in conductive contact with said eighth semiconductor region.

20. A semiconductor device as claimed in claim 17 or 18, further comprising a path switching MISFET of second conductivity type that conductibly isolates said fifth semiconductor region from said eighth semiconductor region, and an electrode in conductive contact with said eighth semiconductor region.

21. A semiconductor device as claimed in claim 20, wherein said path switching MISFET of second conductivity type has a gate electrode formed of a part of a gate electrode of said MISFET of second conductivity type.

22. A semiconductor device as claimed in claim 1, wherein a plurality of gate electrodes of said MISFET of second conductivity type are arranged in parallel in the form of strips on a chip layout, and a plurality of gate wirings connected to a gate pad pierce said plurality of gate electrodes in the form of a lattice.

23. A semiconductor device as claimed in claim 1, wherein the gate electrode of said MISFET of second conductivity type is in an island-like shape disposed on the cross points of a lattice on a chip layout, and a plurality of gate wirings connected to a gate pad pierce said gate electrode in the form of a lattice, and an in-lattice region sectioned by said gate wirings is divided by the lattice-like gate electrode of said MISFET of first conductivity type.

24. A method of manufacturing a semiconductor device as claimed in claim 1, comprising the steps of:

preparing a substrate having a second semiconductor conductive layer on a semiconductor substrate of first conductivity type;

forming on said substrate a first gate electrode and a second gate electrode separately in said first gate electrode;

as a first ion implantation step, ion-implanting impurities of first conductivity type with said first and second gate electrodes as a mask;

as a second ion implantation step, ion-implanting impurities of second conductivity type between said second gate electrodes with said first and second gate electrodes as a mask;

as a diffusion step, diffusing and forming a third semiconductor region like a well by linking contiguous diffusion regions of the impurities of first conductivity type below the second gate electrode of the MISFET by drive-in, and simultaneously diffusing and forming a fourth semiconductor region like a well in said third semiconductor region.

25. A method as claimed in claim 24, wherein a gate length of said second gate electrode is shorter than twice the lateral diffusion length of the impurities of said first conductivity type due to said diffusion step.

26. A method as claimed in claim 24 or 25, wherein the diffusion coefficient of the impurities of said first conductivity type used in said first ion implanting step is larger than that of the impurities of said second conductivity type used in said second ion implanting step.

27. A method as claimed in claim 24, wherein at least one of said first and second gate electrodes has a structure selected from a group consisting of a single-layer structure of metal, a single-layer structure of metal silicide, a double-layer structure of multi-crystal silicon and metal, and a double-layer structure of multi-crystal silicon and metal silicide.

28. A method of manufacturing a semiconductor device as claimed in claim 1, comprising the steps of:

preparing a substrate having a second semiconductor conductive layer on a semiconductor substrate of first conductivity type;

forming a first gate electrode on said substrate;

as a first ion implantation step, ion-implanting impurities of first conductivity type with said first gate electrode as a mask;

forming on said substrate a second gate electrode separately in said first gate electrode;

forming on said substrate a first gate electrode and a second gate electrode separately in said first gate electrode;

as a second ion implantation step, ion-implanting impurities of second conductivity type between said second gate electrodes with said first and second gate electrodes as a mask; and diffusing and forming a third semiconductor region like a well by drive-in and simultaneously a fourth semiconductor region like a well in said third semiconductor region.

29. A method of manufacturing a semiconductor device as claimed in claim 1, comprising the steps of:

preparing a substrate having a second semiconductor conductive layer on a semiconductor substrate of first conductivity type;

forming a first gate electrode on said substrate;

as a first ion implantation step, ion-implanting impurities of first conductivity type with said first gate electrode as a mask;

as a first diffusion step, diffusing and forming a third semiconductor region like a well by drive-in;

forming on said substrate a second gate electrode separately in said first gate electrode;

as a second ion implantation step, ion-implanting impurities of second conductivity type between said second gate electrodes with said first and second gate electrodes as a mask; and as a second diffusion step, diffusing and forming a fourth semiconductor region like a well in said third semiconductor region.

* * * * *

UNITED STATES PATENT AND TRADEMARK OFFICE
CERTIFICATE OF CORRECTION

PATENT NO.   : 5,705,835
DATED        : January 6, 1998
INVENTOR(S)  : NISHIURA et al.

It is certified that error appears in the above-indentified patent and that said Letters Patent is hereby corrected as shown below:

Claim 15, column 32, line 3, "sort-circuit" should read --short-circuit--.

Signed and Sealed this

Tenth Day of August, 1999

Attest:

Q. TODD DICKINSON

Attesting Officer

Acting Commissioner of Patents and Trademarks